United States Patent
Noda

(10) Patent No.: US 9,246,056 B2
(45) Date of Patent: *Jan. 26, 2016

(54) LIGHT EMITTING DEVICE

(71) Applicant: Semiconductor Energy Laboratory Co., Ltd., Kanagawa-ken (JP)

(72) Inventor: Takeshi Noda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 257 days.

This patent is subject to a terminal disclaimer.

(21) Appl. No.: 13/733,267

(22) Filed: Jan. 3, 2013

(65) Prior Publication Data

US 2013/0119379 A1 May 16, 2013

Related U.S. Application Data

(63) Continuation of application No. 12/966,157, filed on Dec. 13, 2010, now Pat. No. 8,362,688, which is a continuation of application No. 11/386,187, filed on Mar. 22, 2006, now Pat. No. 7,851,989.

(30) Foreign Application Priority Data

Mar. 25, 2005 (JP) ................................. 2005-088807

(51) Int. Cl.
*H05B 33/00* (2006.01)
*H01L 33/26* (2010.01)
(Continued)

(52) U.S. Cl.
CPC ............ *H01L 33/26* (2013.01); *H01L 51/5209* (2013.01); *H05B 33/24* (2013.01); *H01L 51/5048* (2013.01)

(58) Field of Classification Search
USPC .................................. 313/498–512; 428/917
See application file for complete search history.

(56) References Cited

U.S. PATENT DOCUMENTS 5,404,075 A 4/1995 Fujikawa et al.
5,989,737 A 11/1999 Xie et al.
(Continued)

FOREIGN PATENT DOCUMENTS

CN 1327360 A 12/2001
EP 0 855 848 A2 7/1998
(Continued)

OTHER PUBLICATIONS

Nakada, T. et al., "Multi Photon Emission Organic EL Devices Using Charge-Transfer Complex as Charge Generation Layer," The Japan Society of Applied Physics, The 63rd Autumn Meeting, Sep. 1, 2002, p. 1165 (with English translation).

(Continued)

*Primary Examiner* — Ashok Patel
(74) *Attorney, Agent, or Firm* — Husch Blackwell LLP

(57) ABSTRACT

It is an object of the present invention to provide a light-emitting device in which, even when a material with high reflectivity such as aluminum is used for an electrode, a layer containing oxygen can be formed over the electrode without increasing contact resistance and a manufacturing method thereof. According to the present invention, a feature thereof is a light-emitting element having an electrode composed of a stacked structure where a conductive film having high reflectivity such as aluminum, silver, and an alloy containing aluminum or an alloy containing silver, and a conductive film composed of a refractory metal material is provided over the conductive film, or a light-emitting device having the light-emitting element.

18 Claims, 14 Drawing Sheets

(51) Int. Cl.
*H01L 51/52* (2006.01)
*H05B 33/24* (2006.01)
*H01L 51/50* (2006.01)

(56) References Cited

U.S. PATENT DOCUMENTS

| | | | |
|---|---|---|---|
| 6,013,384 A | 1/2000 | Kido et al. | |
| 6,215,245 B1* | 4/2001 | Mori | H01L 51/5221 |
| | | | 313/503 |
| 6,380,687 B1 | 4/2002 | Yamazaki | |
| 6,423,429 B2 | 7/2002 | Kido et al. | |
| 6,483,236 B1 | 11/2002 | Hung | |
| 6,486,601 B1 | 11/2002 | Sakai et al. | |
| 6,489,638 B2 | 12/2002 | Seo et al. | |
| 6,501,217 B2 | 12/2002 | Beierlein et al. | |
| 6,518,700 B1 | 2/2003 | Friend et al. | |
| 6,552,496 B2 | 4/2003 | Yamazaki | |
| 6,573,650 B2 | 6/2003 | Aoki et al. | |
| 6,589,673 B1 | 7/2003 | Kido et al. | |
| 6,642,544 B1 | 11/2003 | Hamada et al. | |
| 6,650,047 B2 | 11/2003 | Aoki et al. | |
| 6,774,573 B2 | 8/2004 | Yamazaki | |
| 6,794,278 B2 | 9/2004 | Kido et al. | |
| 6,830,494 B1 | 12/2004 | Yamazaki et al. | |
| 6,993,214 B2 | 1/2006 | Nishimura et al. | |
| 6,995,391 B2 | 2/2006 | Alvarado et al. | |
| 7,030,553 B2 | 4/2006 | Winters et al. | |
| 7,059,928 B2 | 6/2006 | Ikeda | |
| 7,074,500 B2 | 7/2006 | Pfeiffer et al. | |
| 7,098,590 B2 | 8/2006 | Lim et al. | |
| 7,122,836 B2 | 10/2006 | Yamasaki et al. | |
| 7,193,663 B2 | 3/2007 | Shimizu et al. | |
| 7,250,634 B2 | 7/2007 | Yokoyama et al. | |
| 7,276,297 B2 | 10/2007 | Lee et al. | |
| 7,285,905 B2 | 10/2007 | Hanawa et al. | |
| 7,317,497 B2 | 1/2008 | Shimizu et al. | |
| 7,321,196 B2 | 1/2008 | Cheng et al. | |
| 7,323,225 B2 | 1/2008 | Aoki et al. | |
| 7,374,828 B2 | 5/2008 | Kondakova et al. | |
| 7,402,948 B2 | 7/2008 | Yamazaki et al. | |
| 7,416,464 B2 | 8/2008 | Ikeda | |
| 7,417,261 B2 | 8/2008 | Seo et al. | |
| 7,557,501 B2* | 7/2009 | Kim | H01L 27/3258 |
| | | | 313/504 |
| 7,615,792 B2 | 11/2009 | Yokoyama et al. | |
| 7,948,171 B2* | 5/2011 | Sakakura et al. | 313/506 |
| 8,044,580 B2 | 10/2011 | Yamazaki et al. | |
| 8,497,628 B2 | 7/2013 | Yamazaki et al. | |
| 8,633,473 B2* | 1/2014 | Noda et al. | 257/40 |
| 2001/0004190 A1 | 6/2001 | Nishi et al. | |
| 2001/0025959 A1 | 10/2001 | Yamazaki et al. | |
| 2001/0041270 A1 | 11/2001 | Maruyama et al. | |
| 2001/0043046 A1 | 11/2001 | Fukunaga | |
| 2001/0046611 A1 | 11/2001 | Kido et al. | |
| 2001/0053559 A1 | 12/2001 | Nagao et al. | |
| 2002/0093290 A1 | 7/2002 | Yamazaki | |
| 2003/0111666 A1 | 6/2003 | Nishi et al. | |
| 2003/0189401 A1 | 10/2003 | Kido et al. | |
| 2003/0214246 A1 | 11/2003 | Yamazaki | |
| 2004/0140758 A1 | 7/2004 | Raychaudhuri et al. | |
| 2004/0160154 A1 | 8/2004 | Nishimura et al. | |
| 2005/0006667 A1 | 1/2005 | Yamazaki | |
| 2005/0035708 A1 | 2/2005 | Yamazaki et al. | |
| 2005/0084712 A1 | 4/2005 | Kido et al. | |
| 2005/0084713 A1 | 4/2005 | Kido et al. | |
| 2005/0084994 A1* | 4/2005 | Yamazaki et al. | 438/29 |
| 2005/0098207 A1 | 5/2005 | Matsumoto et al. | |
| 2005/0106419 A1 | 5/2005 | Endoh et al. | |
| 2005/0170208 A1 | 8/2005 | Yatsunami et al. | |
| 2005/0248267 A1 | 11/2005 | Gyoutoku et al. | |
| 2005/0249972 A1 | 11/2005 | Hatwar et al. | |
| 2006/0008740 A1 | 1/2006 | Kido et al. | |
| 2006/0033115 A1 | 2/2006 | Blochwitz et al. | |
| 2006/0186804 A1 | 8/2006 | Sakakura et al. | |
| 2007/0182320 A1* | 8/2007 | Nakamura | 313/506 |
| 2007/0200125 A1 | 8/2007 | Ikeda et al. | |
| 2008/0067927 A1 | 3/2008 | Hanawa et al. | |
| 2010/0026176 A1 | 2/2010 | Blochwitz-Nomith et al. | |
| 2014/0027803 A1 | 1/2014 | Yamazaki et al. | |

FOREIGN PATENT DOCUMENTS

| | | |
|---|---|---|
| EP | 0 948 063 A2 | 10/1999 |
| EP | 1 009 198 A1 | 6/2000 |
| EP | 1 065 723 A2 | 1/2001 |
| EP | 1 089 361 A2 | 4/2001 |
| EP | 1 093 167 A2 | 4/2001 |
| EP | 1 128 438 A1 | 8/2001 |
| EP | 1 160 891 A2 | 12/2001 |
| EP | 1 261 042 A1 | 11/2002 |
| EP | 1 351 558 A1 | 10/2003 |
| EP | 1 401 034 A2 | 3/2004 |
| EP | 1 422 977 A1 | 5/2004 |
| EP | 1 424 732 A2 | 6/2004 |
| EP | 1 524 706 A2 | 4/2005 |
| EP | 1 524 707 A2 | 4/2005 |
| EP | 1 530 245 A2 | 5/2005 |
| JP | 1-312873 A | 12/1989 |
| JP | 2-139892 A | 5/1990 |
| JP | 3-114197 A | 5/1991 |
| JP | 3-190088 A | 8/1991 |
| JP | 3-274695 A | 12/1991 |
| JP | 4-357694 A | 12/1992 |
| JP | 5-182766 A | 7/1993 |
| JP | 6-267658 A | 9/1994 |
| JP | 6-290873 A | 10/1994 |
| JP | 7-312289 A | 11/1995 |
| JP | 9-63771 A | 3/1997 |
| JP | 10-255985 A | 9/1998 |
| JP | 10-270171 A | 10/1998 |
| JP | 10-308284 A | 11/1998 |
| JP | 2824411 A | 11/1998 |
| JP | 11-251067 A | 9/1999 |
| JP | 11-297474 A | 10/1999 |
| JP | 11-307259 A | 11/1999 |
| JP | 11-307264 A | 11/1999 |
| JP | 2000-223276 A | 8/2000 |
| JP | 2000-315580 A | 11/2000 |
| JP | 2000-315581 A | 11/2000 |
| JP | 2001-76868 A | 3/2001 |
| JP | 2001-507167 | 5/2001 |
| JP | 2001-185354 A | 7/2001 |
| JP | 2001-244079 A | 9/2001 |
| JP | 2002-015867 A | 1/2002 |
| JP | 2002-15873 A | 1/2002 |
| JP | 2002-56973 | 2/2002 |
| JP | 2002-332567 A | 11/2002 |
| JP | 2002-367784 A | 12/2002 |
| JP | 2003-77681 | 3/2003 |
| JP | 2003-229278 A | 8/2003 |
| JP | 2003-272860 A | 9/2003 |
| JP | 2003-317971 A | 11/2003 |
| JP | 2004-111398 | 4/2004 |
| JP | 2004-134395 A | 4/2004 |
| JP | 2004-514257 A | 5/2004 |
| JP | 2004-170916 | 6/2004 |
| JP | 2004-170918 | 6/2004 |
| JP | 2004-171951 | 6/2004 |
| JP | 2004-178930 | 6/2004 |
| JP | 2004-192890 | 7/2004 |
| JP | 2004-349007 A | 12/2004 |
| JP | 2005-011792 A | 1/2005 |
| JP | 2005-26121 A | 1/2005 |
| JP | 2005-32618 A | 2/2005 |
| JP | 2005-056848 A | 3/2005 |
| JP | 2005-123094 A | 5/2005 |
| JP | 2005-123095 A | 5/2005 |
| JP | 2005-513737 | 5/2005 |
| JP | 2005-166637 A | 6/2005 |
| JP | 2005-520307 | 7/2005 |
| JP | 2005-251587 A | 9/2005 |
| JP | 2005-302696 | 10/2005 |
| JP | 2007-503093 | 2/2007 |
| WO | WO 99/39393 A1 | 8/1999 |

(56) References Cited

FOREIGN PATENT DOCUMENTS

| WO | WO 00/01203 A1 | 1/2000 |
|---|---|---|
| WO | WO 02/41414 A1 | 5/2002 |
| WO | WO 03/055275 A1 | 7/2003 |
| WO | WO 2004/064453 A1 | 7/2004 |
| WO | WO 2004/086531 A1 | 10/2004 |
| WO | WO 2005/006460 A1 | 1/2005 |
| WO | WO 2005/020344 A1 | 3/2005 |

OTHER PUBLICATIONS

Tokito, S. et al., "Metal Oxides as a Hole-Injecting Layer for an Organic Electroluminescent Device," Journal of Physics D: Applied Physics, vol. 29, 1996, pp. 2750-2753.

International Search Report re Application No. PCT/JP2004/014412, dated Mar. 22, 2005.

Written Opinion re Application No. PCT/JP2004/014412, dated Mar. 22, 2005.

International Search Report re Application No. PCT/JP2004/019466, dated Apr. 12, 2005.

Written Opinion re Application No. PCT/JP2004/019466, dated Apr. 12, 2005.

Chinese Office Action re Application No. 200480027991.7, dated Feb. 6, 2009 (with English translation).

Tokito, S. et al., "Metal Oxides as a Hole-Injecting Layer for an Organic Electroluminescent Device," Journal of Physics D: Applied Physics, vol. 29, No. 11, 1996, pp. 2750-2753.

* cited by examiner

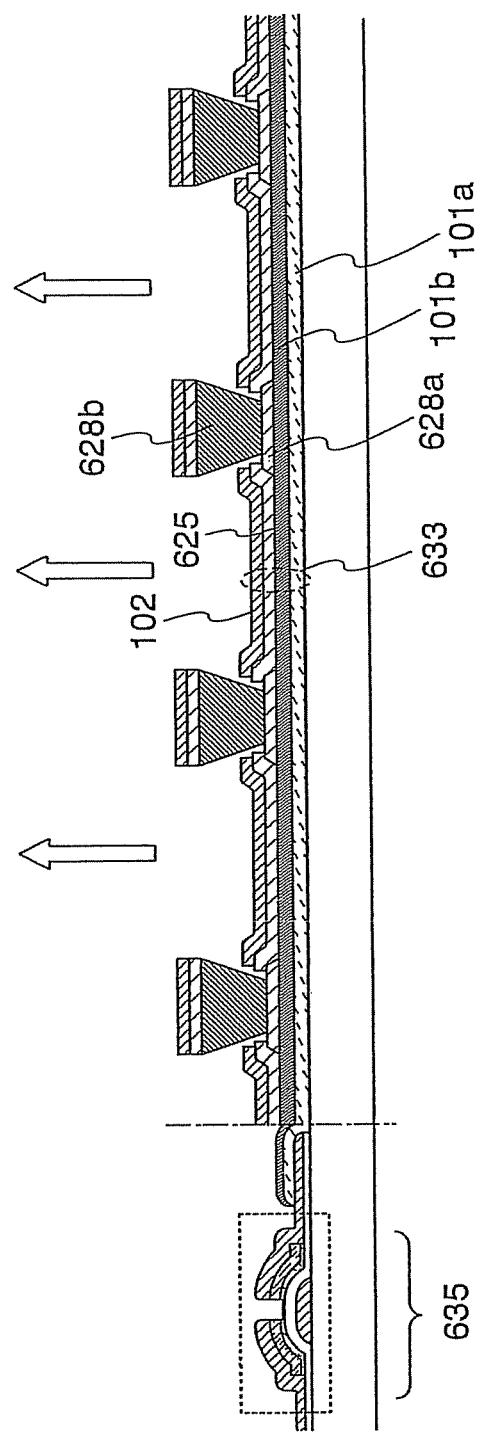

LIGHT EMITTING DEVICE

This application is a continuation of copending application Ser. No. 12/966,157 filed on Dec. 13, 2010 which is a continuation of application Ser. No. 11/386,187 filed on Mar. 22, 2006 (now U.S. Pat. No. 7,851,989 issued Dec. 14, 2010).

BACKGROUND OF THE INVENTION

1. Field of the Invention

The present invention relates to a light-emitting device having a light-emitting element.

2. Description of the Related Art

A display device including a light-emitting element (hereinafter, referred to as a light-emitting device) has advantages such as wide viewing angle, low power consumption, and rapid response speed as compared with a liquid crystal display device, and research and development thereof have been actively carried out.

The light-emitting element has a structure of a light-emitting substance provided between a pair of electrodes, and light from the light-emitting substance is extracted depending on the light-transmitting property of the electrodes.

For example, in the case of desiring to extract light toward one direction, a light-transmitting material is used for one electrode provided in the direction where light is extracted whereas the other electrode is formed by using a material that has no light-transmitting property, that is, a reflective material. The light extraction efficiency can be increased by using reflection at the other electrode effectively.

In addition, a display device is proposed, where the optical distance between a pair of electrodes is made to satisfy a given formula, a resonator structure is introduced, and the resonance wavelength coincides with the peak wavelength of a spectrum of light to be extracted (see Reference 1: Japanese Patent Application Laid-Open No. 2004-178930).

However, an anode is used as a reflective electrode in a top emission panel as shown in Reference 1; therefore, it is desirable to use a material with high reflectivity in visible light such as aluminum or silver. Since silver is difficult to process, aluminum is used as an anode in many cases.

However, a material with high reflectivity such as aluminum or silver is easily oxidized and gets close to an insulator property after oxidizing; therefore, contact resistance thereof gets high. In particular, in a case of forming a layer containing oxygen over a conductive film of aluminum, silver, or the like, the conductive film is easily oxidized. Therefore, contact resistance thereof gets high and consequently current cannot be supplied enough; thus, drive voltage has increased.

Thus, it is an object of the present invention to provide a light-emitting device in which, even when a material with high reflectivity in visible light such as aluminum or silver is used for an electrode, a layer containing oxygen can be formed over the electrode without increasing contact resistance and a manufacturing method thereof.

In view of the above problem, the present invention has a feature of an electrode composed of a stacked structure where a conductive film with high reflectivity that is easily oxidized such as aluminum (Al), silver (Ag), an alloy containing aluminum (Al alloy), or an alloy containing silver (Ag alloy) is stacked with a conductive film composed of a refractory metal material provided in the upper layer of the conductive film.

In addition, a light-emitting device according to the present invention includes a light-emitting element where a mixture layer having a metal oxide, which is a layer containing oxygen, is provided over a conductive film made of a refractory metal material. In other words, a feature of the present invention is to form a mixture layer having a metal oxide in contact with a conductive film made of a refractory metal material which is one of the electrodes having a stacked structure. Note that the conductive film made of a refractory metal material may be formed using a material that is not oxidized due to the mixture layer having a metal oxide or, even when a material is oxidized, any material is acceptable as long as conductivity is shown. In addition, the conductive film made of a refractory metal material can be described as a material having low contact resistance with a metal oxide. As for a material of such a conductive film made of a refractory metal material, titanium (Ti), tungsten (W), molybdenum (Mo), or a compound having these materials, for example, titanium nitride (TiN) which is a titanium compound can be used.

In such a light-emitting element according to the present invention, a transparent electrode material such as indium tin oxide (ITO) is used for a transparent electrode on the side where light from a light-emitting element is emitted. In addition, besides ITO, a material having reflectiveness with high reflectivity, in other words, a material that does not have a light-transmitting property, the film thickness of which is thinned to such a degree that light is transmitted, may also be used. When a material having reflectiveness is thus used for the electrode on the side where light is transmitted, light from a light-emitting element can be interfered between the electrode formed by thinning the material having reflectiveness and the reflective electrode; thus, efficiency in extracting light outside can be increased.

Moreover, in a light-emitting element according to the present invention, light through a light-emitting layer reflected with the reflective electrode and light emitted directly through the light-emitting layer interfere; thus, efficiency in extracting light outside can also be increased. In order to increase extraction efficiency in such a manner, a film thickness of any one of layer in an electroluminescent layer, specifically, a layer between the reflective electrode and the light-emitting layer is controlled. In addition, the film thickness may be made different depending on light-emission color so as to increase the extraction efficiency.

Hereinafter, a specific mode of the present invention will be shown.

According to one feature of the present invention, a light-emitting device includes a first electrode which is stacked; an electroluminescent layer provided over the first electrode; and a second electrode provided over the electroluminescent layer, wherein the electroluminescent layer includes a mixture layer having a metal oxide on the side in contact with the first electrode, and wherein the first electrode includes a conductive film made of a material having low contact resistance with the mixture layer having a metal oxide. The material having low contact resistance with the mixture layer having a metal oxide is a refractory metal material.

According to another feature of the present invention, a light-emitting device includes a first conductive layer and a second conductive layer included in a first electrode; an electroluminescent layer provided in contact with the second conductive layer; and a second electrode provided over the electroluminescent layer, wherein a mixture layer having a metal oxide is provided in a region of the electroluminescent layer in contact with the second conductive layer, and wherein the second conductive layer is formed of a conductive film made of a material having low contact resistance with the mixture layer having a metal oxide. The material having low contact resistance with the mixture layer having a metal oxide is a refractory metal material.

According to another feature of the present invention, a light-emitting device includes a first electrode having reflectiveness which is stacked; an electroluminescent layer provided over the first electrode; and a second electrode having a light-transmitting property which is provided over the electroluminescent layer, wherein the first electrode includes a conductive film made of a refractory metal material on the side in contact with the electroluminescent layer, and wherein the electroluminescent layer includes a mixture layer having a metal oxide on the side in contact with the first electrode. Titanium nitride can be given as an example of the refractory metal material.

According to another feature of the present invention, a light-emitting device includes a first conductive layer and a second conductive layer included in a first electrode having reflectiveness; an electroluminescent layer provided in contact with the second conductive layer; and a second electrode having a light-transmitting property which is provided over the electroluminescent layer, wherein the second conductive layer is made of a refractory metal material, and wherein a mixture layer having a metal oxide is provided in a region of the electroluminescent layer in contact with the second conductive layer. Titanium nitride can be given as an example of the refractory metal material.

According to another feature of the present invention, a light-emitting device includes a plurality of light-emitting elements, in which red, green, and blue light are emitted, having a first electrode which is stacked; an electroluminescent layer provided over the first electrode; and a second electrode provided over the electroluminescent layer, wherein the first electrode includes a conductive film made of titanium nitride on the side in contact with the electroluminescent layer, wherein the electroluminescent layer includes a mixture layer having a metal oxide on the side in contact with the first electrode, wherein the film thickness of the first electrode is the same in the light-emitting element in which red, green, and blue light are emitted, and wherein the film thickness of the electroluminescent layer, specifically, the mixture layer having a metal oxide is different.

According to another feature of the present invention, a light-emitting device includes a plurality of light-emitting elements, in which red, green, and blue light are emitted, having a first conductive layer and a second conductive layer included in a first electrode; an electroluminescent layer provided in contact with the second conductive layer; and a second electrode provided over the electroluminescent layer, wherein the second conductive layer is made of titanium nitride, wherein a mixture layer having a metal oxide is provided in a region of the electroluminescent layer in contact with the second conductive layer, wherein the film thickness of the first electrode is the same in the light-emitting element in which red, green, and blue light are emitted, and wherein the film thickness of the electroluminescent layer, specifically, the film thickness of the mixture layer having a metal oxide is different.

In addition, according to the present invention, a thin film transistor is connected to a first electrode as a switching element. The thin film transistor has an n-channel type or a p-channel type.

Note that a transparent conductive layer such as indium tin oxide (ITO) may be used instead of a mixture layer of a metal oxide for a layer in contact with the first electrode of an electroluminescent layer. In a case of using a transparent conductive layer, a refractory metal material having low contact resistance with the transparent conductive layer may be used for the upper layer of the first electrode.

In addition, as for a reflective electrode, an aluminum alloy, silver, or a silver alloy may be used instead of aluminum. This is because an aluminum alloy, silver, and a silver alloy are also a metal material having reflectiveness. Moreover, titanium (Ti), tungsten (W), or molybdenum (Mo) may be used instead of titanium nitride. In a case of substituting these materials, as for a side in contact with a mixture layer having a metal oxide, which is the lower layer of the electroluminescent layer, a refractory metal material having low contact resistance with the mixture layer is used for the upper layer of the first electrode.

A stacked structure of an electrode material having high reflectiveness such as aluminum and a refractory metal material such as titanium nitride is used for a reflective electrode of a light-emitting element. Accordingly, high light extraction efficiency can be obtained concurrently with preferable contact resistance between a mixture layer having a metal oxide and the reflective electrode. Consequently, it is possible to provide a light-emitting element and a light-emitting device having high luminance compared with a conventional case where a single aluminum layer or a single titanium nitride, which is a reflective electrode is used.

These and other objects, features and advantages of the present invention will become more apparent upon reading of the following detailed description along with the accompanied drawings.

BRIEF DESCRIPTION OF THE DRAWINGS

In the accompanying drawings:

FIG. 14 is a cross-sectional view showing a pixel having a light-emitting element according to the present invention.

DETAILED DESCRIPTION OF THE INVENTION

Figure 1:
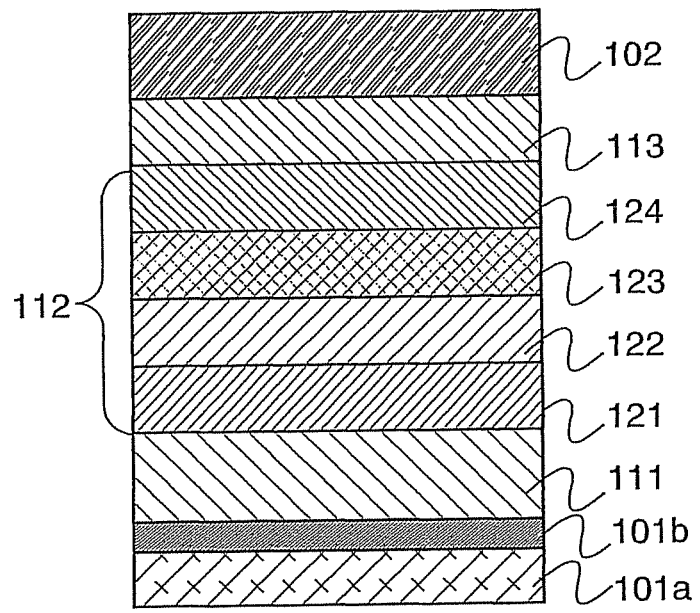
FIG. 1 is a view showing a light-emitting element according to the present invention.

Embodiment Modes of the present invention will be explained below with reference to the accompanying drawings. However, it is to be easily understood that various changes and modifications will be apparent to those skilled in the art. Therefore, unless such changes and modifications depart from the scope of the invention, they should be construed as being included therein. Note that identical portions or portions having the same function in all figures for explaining embodiment modes are denoted by the same reference numerals and detailed descriptions thereof are omitted.

Embodiment Mode 1

In this embodiment mode, a structure of a light-emitting element will be explained.

As shown in FIG. 1, a light-emitting element according to the present invention has a first electrode 101 and a second electrode 102 which oppose to each other, and a first layer 111, a second layer 112, and a third layer 113 are sequentially stacked over the first electrode 101. Such a light-emitting element can emit light when there is potential difference between the first electrode 101 and the second electrode 102. For example, when the first electrode has higher potential than that of the second electrode, holes are injected from the first layer 111 to the second layer 112 and electrons are injected from the third layer 113 to the second layer 112. The holes and the electrons are recombined in the second layer 112 and light-emitting substances are excited. Then, the excited light-emitting substances emit light in returning to a ground state; thus, light emission can be obtained from the second electrode 102. Such light emission can be obtained by emitting light through the light-transmitting second electrode 102. In other words, a light-transmitting material is used for the electrode through which it is desired to extract light emission.

The first electrode 101 has reflectiveness, whereas the second electrode 102 has a light-transmitting property. The electrode having reflectiveness can be referred to as a reflective electrode and the electrode having a light-transmitting property can be referred to as a transparent electrode.

In such a light-emitting element, the first electrode 101 is composed of at least two conductive layers 101a and 101b. In other words, the first electrode 101 is formed to have a stacked structure. Consequently, concurrently with increase in reflectivity of light with respect to the first electrode, contact resistance with the first layer 111 can be made preferable even when a layer having oxygen is used for the first layer 111.

Aluminum, silver, an aluminum alloy, a silver alloy, or an alloy containing any one of them each having high reflectiveness can be used for the first conductive layer 101a. Such a material having high reflectiveness is easily oxidized; therefore, there is a fear that oxide is formed over the surface in subsequently forming the first layer 111. When oxide is formed, an insulating property is shown; thus, contact resistance is increased.

Therefore, a refractory metal material, for example, titanium nitride, titanium, tungsten, or molybdenum can be used for the second conductive layer 101b in consideration of contact resistance with the first layer 111. In other words, as the second conductive layer 101b, which is a conductive layer made of a refractory metal material, a material that is not oxidized by forming a mixture layer having a metal oxide or, even when oxidized, a material showing conductivity is used.

Note that a mixture layer having a metal oxide is a layer in which the metal oxide and an organic compound are mixed. In the mixture layer, the metal oxide and an organic compound do not have to be definitely mixed but includes a state in which the metal oxide and an organic compound are mixed enough to be manufactured by a co-evaporation method. For example, as a result of manufacturing the mixture layer by a co-evaporation method, a state in which each layer is stacked extremely thinly is included.

According to this structure, contact resistance with the first layer 111 can be made preferable concurrently with increase in reflectiveness of the first electrode 101.

In addition, as for a transparent electrode which is the second electrode 102, ITO, ITSO in which ITO is mixed with silicon, indium oxide containing zinc oxide of 2 to 20%, or the like can be used. Moreover, the second electrode 102 may be formed by thinning the reflective material so as to have translucency. By using such a reflective material, light emission can be interfered between the first electrode 101 and the second electrode 102; thus, light extraction efficiency can be increased.

These reflective electrode and transparent electrode can be formed by using a sputtering method, a vapor deposition method, or the like. In addition, in the reflective electrode, the first conductive layer 101a and the second conductive layer 101b can also be formed continuously without being exposed to an atmosphere. Further, the first electrode 101 to the second electrode 102 can also be formed continuously without being exposed to an atmosphere. These are advantageous in preventing impurity contamination of a light-emitting element.

Next, a structure of the first layer 111 to the third layer 113 will be explained.

The first layer 111 is a layer for generating holes. As for such a layer, for example, a layer containing a hole-transporting substance and a substance that shows electron acceptability to the hole-transporting substance can be given. In addition, preferably, the first layer 111 contains the substance that shows electron acceptability to the hole-transporting substance so as to satisfy that a molar ratio (i.e., the substance that shows electron acceptability to the hole-transporting substance/the hole-transporting substance) of 0.5 to 2.

The hole-transporting substance is a substance having higher transportability of holes than that of electrons. For example, an organic compound including an aromatic amine compound such as 4,4'-bis[N-(1-naphthyl)-N-phenylamino]biphenyl (abbreviation: α-NPD), 4,4'-bis[N-(3-methylphenyl)-N-phenylamino]biphenyl (abbreviation: TPD), 4,4',4''-tris(N,N-diphenylamino)triphenylamine (abbreviation: TDATA), 4,4,4''-tris[N-(3-methylphenyl)-N-phenylamino]triphenylamine (abbreviation: MTDATA), or 4,4'-bis[N-{4-(N,N-di-m-tolylamino)phenyl}-N-phenylamino]biphenyl (abbreviation: DNTPD); a phthalocyanine compound such as phthalocyanine (abbreviation: $H_2Pc$), phthalocyanine copper (abbreviation: CuPc), or vanadyl phthalocyanine (abbreviation: VOPc); or the like can be used. Note that the hole-transporting substance is not limited thereto.

In addition, as for the substance that shows electron acceptability to the hole-transporting substance, any one of a metal oxide of vanadium oxide, molybdenum oxide, niobium oxide, rhenium oxide, tungsten oxide, ruthenium oxide, titanium oxide, chromium oxide, zirconium oxide, hafnium oxide, tantalum oxide, and the like can be used. Note that the substance that shows electron acceptability to the hole-transporting substance is not limited thereto.

It is possible to manufacture the mixture layer where an organic compound to be a hole-transporting substance is mixed with a metal oxide that shows electron acceptability to the hole-transporting substance by a co-evaporation method. Specifically, the first layer 111 can be formed by combining the same kinds of methods or the different kinds of methods such as a co-evaporation method with resistance heating evaporation methods, a co-evaporation method with electron beam evaporation methods, a co-evaporation method with a resistance heating evaporation method and an electron beam evaporation method, deposition with a resistance heating evaporation method and a sputtering method, or deposition with an electron beam evaporation method and a sputtering method. In addition, although a layer containing two kinds of materials are assumed in the above examples, the first layer 111 can be similarly formed in a case of containing three or more kinds of materials.

Note that the first layer 111 may contain another organic compound. Rubrene or the like can be given as an example of another organic compound. Reliability can be improved by adding rubrene.

Besides, the first layer 111 may also be a layer made of a metal oxide such as molybdenum oxide, vanadium oxide, ruthenium oxide, cobalt oxide, or copper oxide.

However, being formed of the mixture layer having an organic compound and a metal oxide as mentioned above, the first layer 111 has high conductivity. This is preferable because a film thickness of the first layer 111 can be thick when the conductivity is high. Consequently, it is possible to prevent a short circuit between the first electrode 101 and the second electrode 102.

Further, efficiency in extracting light outside in a light-emitting element can also be increased by interfering light through a light-emitting layer that is reflected with the first electrode 101 and light emitted directly through the light-emitting layer in the light-emitting element. In order to increase light extraction efficiency in such a manner, a film thickness of the first layer 111 is controlled. In addition, a film thickness of the first layer 111 is preferably made different in each light-emission color depending on light through a light-emitting element.

A material that has preferable contact resistance with such a first layer 111 is used for the second conductive layer 101b which is the upper layer of the first electrode 101. In this embodiment mode, a mixture layer containing molybdenum oxide is used for the first layer 111, titanium nitride is used for the second conductive layer 101b, and aluminum is used for the first conductive layer 101a which is the lower layer of the first electrode 101. Consequently, high light extraction efficiency, can be obtained concurrently with preferable contact resistance between the first electrode 101 and the First layer 111.

The second layer 112 is a layer including a light-emitting layer. A structure of the second layer 112 may be a single layer or a multilayer. For example, as shown in FIG. 1, the second layer 112 can have a functionally different layer such as a hole-transporting layer 121, an electron-transporting layer 123, and an electron-injecting layer 124 besides a light-emitting layer 122. Needless to say, the second layer 112 may be a single layer that only includes the light-emitting layer 122.

In addition, the second layer 112 is preferable to have a layer in which a light-emitting substance is included to disperse in a layer formed of a substance having an energy gap larger than that of the light-emitting substance. Note that the light-emitting substance is a substance with preferable luminous efficiency, which can emit light with a desired emission wavelength. Note that the energy gap indicates an energy gap between the LUMO level and the HOMO level.

As for a substance used to disperse a light-emitting substance, for example, a metal complex such as bis[2-(2'-hydroxyphenyl)pyridinato]zinc (abbreviation: $Znpp_2$) or bis[2-(2'-hydroxyphenyl)benzoxazolate]zinc (abbreviation: ZnBOX), or the like can be used in addition to an anthracene derivative such as 9,10-di(2-naphthyl)-2-tert-butylanthracene (abbreviation: t-BuDNA) or a carbazole derivative such as 4,4'-di(N-carbazolyl)biphenyl (abbreviation: CBP). However, the substance used to disperse a light-emitting substance is not limited to these materials. With the above structure, light emission from a light-emitting substance can be prevented from being quenched due to the concentration.

In order to obtain red light emission, for example, the following can be used for the second layer 112: 4-dicyanomethylene-2-isopropyl-6-[2-(1,1,7,7-tetramethyljulolidine-9-yl)ethenyl]-4H-pyran (abbreviation: DCJTI), 4-dicyanomethylene-2-methyl-6-[2-(1,1,7,7-tetramethyljulolidine-9-yl)ethenyl]-4H-pyran (abbreviation: DCIT), 4-dicyanomethylene-2-tert-butyl-6-[2-(1,1,7,7-tetramethyljulolidine-9-yl)ethenyl]-4H-pyran (abbreviation: DCJTB), periflanthen, 2,5-dicyano-1,4-bis[2-(10-methoxy-1,1,7,7-tetramethyljulolidine-9-yl)ethenyl]benzene, bis[2,3-bis(4-fluorophenyl)quinoxalinato]iridium(acetylacetonate) (abbreviation: $Ir[Fdpq]_2(acac)$), or the like. However, the present invention is not limited to these materials and a substance which can emit light with a peak of emission spectrum in 600 nm or more and 680 nm or less can be used.

In order to obtain green light emission, N,N'-dimethylquinacridon (abbreviation: DMQd), coumarin 6, coumarin 545T, tris(8-quinolinolato)aluminum (abbreviation: $Alq_3$), or the like can be used. However, the present invention is not limited to these materials, and a substance which can emit light with a peak of emission spectrum in 500 nm or more and 550 nm or less can be used for the second layer 112.

In order to obtain blue light emission, the following can be used for the second layer 112: 9,10-di(2-naphthyl)-tert-butylanthracene (abbreviation: t-BuDNA), 9,9'-bianthryl, 9,10-diphenylanthracene (abbreviation: DPA), 9,10-di(2-naphthyl)anthracene (abbreviation: DNA), bis(2-methyl-8-quinolinolato)-4-phenylphenolate-gallium (abbreviation: BGaq), bis(2-methyl-8-quinolinolato)-4-phenylphenolate-aluminum (BAlq), or the like. However, the present invention is not limited to these materials, and a substance which can emit light with a peak of emission spectrum in 420 nm or more and 500 nm or less can be used.

Note that, as shown in FIG. 1, the distance from the first electrode 101 to the light-emitting layer 122 can be increased by providing the hole-transporting layer 121. Thus, quenching of light due to the metal can be prevented. Note that the hole-transporting layer 121 has a function of transporting holes injected from the first electrode 101 to the light-emitting layer 122. As a specific material, the above α-NPD, TPD, TDATA, MTDATA, DNTPD, or the like can be used for the hole-transporting layer 121. However, the hole-transporting layer 121 is not particularly limited thereto. The hole-transporting layer 121 can be formed using the above hole-transporting substance the hole mobility of which is higher than the electron mobility. Specifically, the hole-transporting layer 121 is preferably formed using a substance having the hole mobility of $10^{-6}$ $cm^2/Vs$ or more. The hole-transporting layer 121 may have a multilayer structure where two or more layers including the above substances are stacked.

In addition, as shown in FIG. 1, the electron-transporting layer 123 can be provided between the second electrode 102 and the light-emitting layer 122. The distance from the second electrode 102 to the light-emitting layer 122 can be increased by providing the electron-transporting layer 123. Thus, quenching of light due to the metal can be prevented. The electron-transporting layer 123 has a function of transporting injected electrons to the light-emitting layer 122. As a specific material, the electron-transporting layer 123 can be formed using $Alq_3$, $Almq_3$, $BeBq_2$, BAlq, $Zn(BOX)_2$, $Zn(BTZ)_2$, PBD, OXD-7, TAZ, p-EtTAZ, BPhen, BCP, or the like. Without being limited to these materials, the electron-transporting layer 123 may be formed by using an electron-transporting substance the electron mobility of which is higher than the hole mobility. Specifically, the electron-transporting layer 123 is preferably formed by using a substance having the electron mobility of $10^{-6}$ cm$^2$/Vs or more. Moreover, the electron-transporting layer 123 may have a multilayer structure where two or more layers made of the above substances are stacked.

Further, as shown in FIG. 1, the electron-injecting layer 124 may be formed between the second electrode 102 and the electron-transporting layer 123. Note that the electron-injecting layer 124 has a function of helping the injection of electrons into the electron-transporting layer 123 from the second electrode 102 and the like. As a specific material, the electron-injecting layer 124 can be formed using alkali metal salt and alkali earth metal salt such as calcium fluoride, lithium fluoride, lithium oxide, and lithium chloride or the like. In addition, a layer of a material with an electron-transporting property to which a donor compound such as lithium is added, for example, tris(8-quinolinolato) aluminum (abbreviation: Alq$_3$) and bathocuproin (abbreviation: BCP) and the like, can be used for the electron-injecting layer 124. Moreover, the electron-injecting layer 124 may be formed using the above layer containing the electron-transporting substance and the substance that shows electron donating property to the electron-transporting substance. However, the electron-injecting layer 124 is not limited thereto.

Note that the layer in contact with the first layer 111 among the layers included in the second layer 112 corresponds to the hole-transporting layer 121 in the case where the second layer 112 has a stacked structure.

Furthermore, the third layer 113 is a layer for generating electrons. As for such a layer, for example, a layer containing an electron-transporting substance and a substance that shows an electron-donating property to the electron-transporting substance can be given. Note that the electron-transporting substance is a substance having higher transportability of electrons than that of holes. For example, a metal complex such as tris(8-quinolinolato)aluminum (abbreviation: Alq$_3$), tris(4-methyl-8-quinolinolato)aluminum (abbreviation: Almq$_3$), bis(10-hydroxybenzo[h]-quinolinato)beryllium (abbreviation: BeBq$_2$), bis(2-methyl-8-quinolinolato)-4-phenylphenolate-aluminum (abbreviation: BAlq), bis[2-(2'-hydroxyphenyl)benzoxazolate]zinc (abbreviation: Zn(BOX)$_2$), or bis[2-(2'-hydroxyphenyl)benzothiazolate] zinc (abbreviation: Zn(BTZ)$_2$) can be used. In addition, the following substance can be used as the electron-transporting substance: 2-(4-biphenylyl)-5-(4-tert-butylphenyl)-1,3,4-oxadiazole (abbreviation: PBD), 1,3-bis[5-(4-tert-butylphenyl)-1,3,4-oxadiazole-2-yl]benzene (abbreviation: OXD-7), 3-(4-biphenylyl)-4-phenyl-5-(4-tert-butylphenyl)-1,2,4-triazole (abbreviation: TAZ), 3-(4-biphenylyl)-4-(4-ethylphenyl)-5-(4-tert-butylphenyl)-1,2,4-triazole (abbreviation: p-EtTAZ), bathophenanthroline (abbreviation: BPhen), bathocuproin (abbreviation: BCP), 4,4'-bis(5-methyl-benzoxazol-2-yl)stilbene (abbreviation: BzOS), or the like. However, the electron-transporting substance is not limited thereto.

In addition, an alkali metal such as lithium and cesium, alkaline earth metal such as magnesium or calcium, rare-earth metal such as erbium or ytterbium, or the like can be used as the substance that shows an electron-donating property to the electron-transporting substance. However, the substance that shows an electron-donating property to the electron-transporting substance is not limited thereto. Preferably, the third layer 113 contains the substance that shows an electron-donating property to the electron-transporting substance so as to satisfy a molar ratio (i.e., the substance that shows an electron-donating property to the electron-transporting substance/the electron-transporting substance) of 0.5 to 2.

Moreover, the third layer 113 may contain a substance such as zinc oxide, zinc sulfide, zinc selenide, tin oxide, or titanium oxide.

Further, there is a case where the second layer 112 has a single layer structure only of the light-emitting layer or a case where the second layer 112 does not have the hole-transporting layer 121 or the like. When the light-emitting layer is in contact with the third layer 113 in such a case, a substance, which is included in a layer in contact with the third layer 113 among the layers included in the second layer 112, corresponds to a substance used for dispersing light-emitting substance. In addition, the layer may correspond to a light-emitting substance itself. This is because a light-emitting substance can emit light even when a light-emitting substance is particularly not dispersed like Alq$_3$ or the like, and because a layer composed only of Alq$_3$ can be made to serve as a light-emitting layer without being dispersed in a light-emitting substance having preferable carrier transportability.

As described above, the second layer 112 and the third layer 113 are joined, and thus, electrons can be easily injected from the second layer 112 into the third layer 113.

In the light-emitting element as mentioned above, a conductive layer made of a refractory metal material in contact with the mixture layer having a metal oxide is formed as the first electrode. As for the conductive layer provided to be in contact with the mixture layer having a metal oxide, a material that is not oxidized by forming a mixture layer having the metal oxide or, even when oxidized, a material which shows conductivity may be used. According to the present invention, contact resistance between the first electrode 101 and the first layer 111 can be made preferable concurrently with increase in reflectiveness of the first electrode 101. Note that the present invention is not limited to the structure of a light-emitting element shown in FIG. 1 as long as the above effect can be obtained. For example, in a case where the second electrode 102 is a reflective electrode and the mixture layer having a metal oxide is applied to the third layer 113, a conductive layer made of a refractory metal material in contact with the mixture layer having a metal oxide is formed as the second electrode 102 having a stacked structure. Consequently, contact resistance with the third layer 113 can be made preferable concurrently with increase in reflectiveness of the second electrode 102.

Embodiment Mode 2

Further, according to the present invention, a film thickness of any one of layer in an electroluminescent layer may be differed depending on a light-emitting element in which each light-emission color (red, green, and blue) is emitted. Consequently, light extraction efficiency of a light-emitting element the emission wavelength of which differs can be increased. In this embodiment mode, in addition to the electrode structure shown in Embodiment Mode 1, a light-emitting element in which a film thickness of any one of layer in an electroluminescent layer, in other words, layers except a first electrode and a second electrode will be explained.

Figure 2:
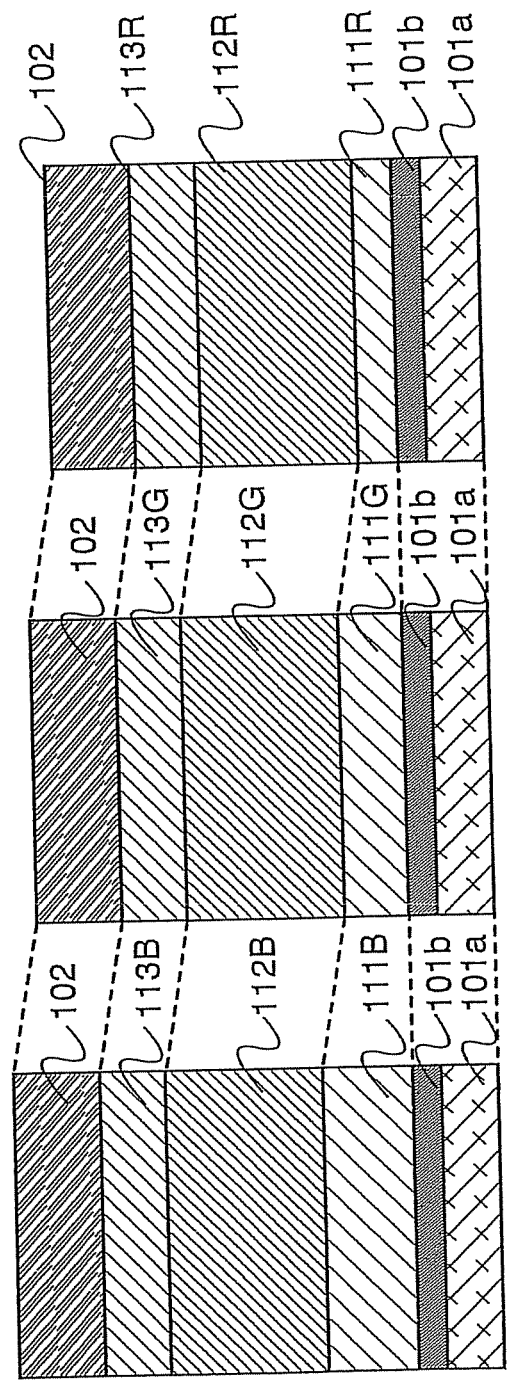
FIG. 2 is a view showing a light-emitting element according to the present invention.

As shown in FIG. 2, light-emitting elements that emit light of red (R), green (G) and blue (B) share the film thickness of a first electrode 101 having reflectiveness and a second electrode 102 having a light-transmitting property, and further the film thickness of any one of first layers 111R, 111G and 111B, second layers 112R, 112G and 112B, and third layers 113R, 113G and 113B is made different. For example, the film thickness of any of the first layers 111R, 111G, and 111B is made different depending on each light-emission color. Consequently, light extraction efficiency of a light-emitting element the emission wavelength of which differs can be increased.

When light from a light-emitting region enters, the first electrode which is a reflective electrode, phase reversal is generated in the reflected light, thereby generating the effect of interference of light for reflected light and direct light. Consequently, in a case where an optical distance between the light-emitting region and the reflective electrode (corresponding to refractive index×distance) is $(2m-1)/4$ times ($m$ is a given positive integer) of the emission wavelength, specifically, in a case where the optical distance is ¼, ¾, 5/4... times of the emission wavelength, the light extraction efficiency is increased. In the meanwhile, in a case where the optical distance is m/2 times (m is a given positive integer), specifically, ½, 1, 3/2... times of the emission wavelength, the light extraction efficiency is decreased.

Therefore, in the light-emitting element according to the present invention, the film thickness of any one of the first layer 111 to the third layer 113 is preferably made different in each light-emitting element so that the optical distance between the light-emitting region and the reflective electrode is $(2m-1)/4$ times (m is a given positive integer) of the emission wavelength.

In particular, in the first layer 111 to the third layer 113, it is preferable that the film thickness of a layer between the light-emitting region in which electrons and holes are recombined and the reflective electrode is made different. In addition, the film thickness of a layer between the light-emitting region and the second electrode 102, which is a transparent electrode, may be made different. Alternatively, the film thicknesses of the both layers may be made different. Accordingly, the film thickness of each layer is decided so that emission light can be extracted outside efficiently.

In order to make different the film thickness of any one of the first layer 111 to the third layer 113, the layers have to be formed thick. The layers are formed thick using a mixture layer where an organic compound and a metal oxide, which is an inorganic compound, are mixed.

In general, when layers of a light-emitting element are formed thick, drive voltage is increased, which is not preferable. However, even in a case where the mixture layer where an organic compound and a metal oxide, which is an inorganic compound, are mixed is formed thick, drive voltage is not increased. Further, it is possible to reduce drive voltage itself.

Then, by forming thick any one of the first layer 111 to the third layer 113, a short circuit of the first electrode 101 and the second electrode 102 can be prevented and mass productivity can be increased, which is extremely preferable.

In addition, in a case of forming the first layer 111 to the third layer 113 by a vapor deposition method using a vapor deposition mask, the same vapor deposition mask can be used. On the other hand, in a case of making different the thickness of the reflective electrode or the transparent electrode, it is considered that a photolithography step and an etching step are necessary, which leads to increase in the number of steps. Therefore, it is preferable that the film thickness of any one of the first layer 111 to the third layer 113 is made different.

Light extraction efficiency can be further increased by combining a structure in which the film thickness is made different in such a manner.

Embodiment Mode 3

In this embodiment mode, a cross-sectional structure of a pixel included in a light-emitting element according to the present invention will be explained. In addition, a transistor for controlling current supplied to a light-emitting element (hereinafter, referred to as a driving transistor) is to be a p-type thin film transistor (TFT).

Figure 3:
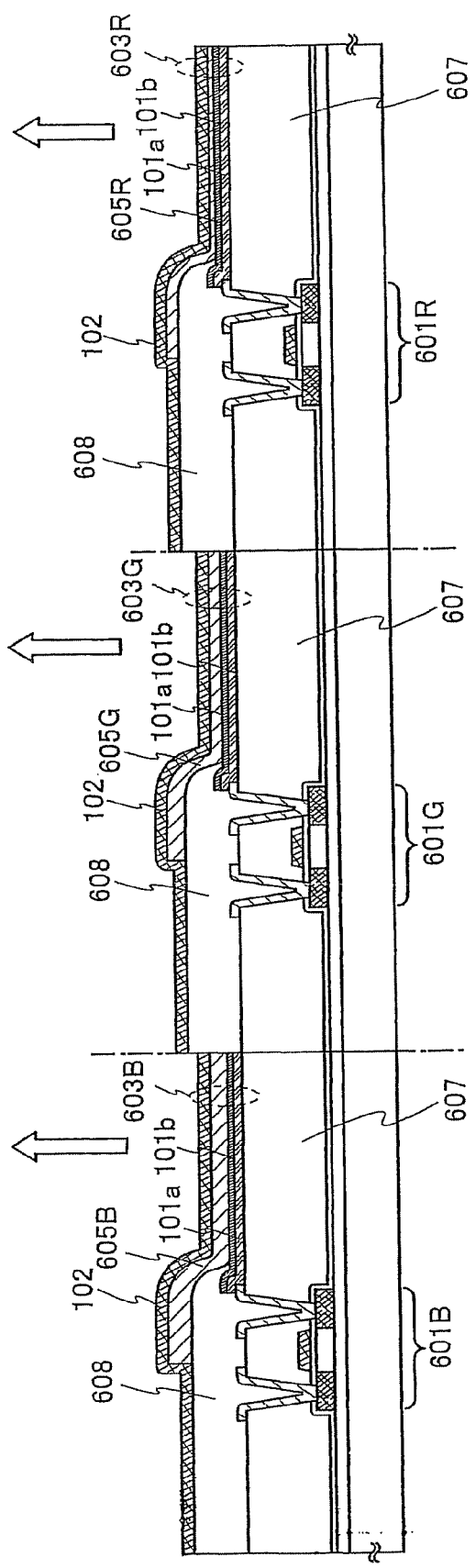
FIG. 3 is a cross-sectional view showing a pixel having a light-emitting element according to the present invention.

FIG. 3 is a cross-sectional view, which shows a so-called top emission type in which light emitted from each of light-emitting elements 603R, 603G, and 603B is extracted through a second electrode 102. In addition, each light-emission color (RGB) can be emitted from the light-emitting elements 603R, 603G, and 603B, respectively (hereinafter, referred to as a light-emitting element 603 together). The light-emitting elements 603 each have a stacked first electrode 101 (including a first conductive layer 101a and a second conductive layer 101b) and the second electrode 102, and electroluminescent layers 605R, 605G, and 605B are provided therebetween. The electroluminescent layers 605R, 605G, and 605B correspond to the first layer 111 to the third layer 113, respectively. The first electrode 101 is electrically connected with TFTs 601R, 601G and 601B, respectively.

The TFTs 601R, 601G, and 601B are 10 to 200 nm thick, and their channel forming regions are formed with island-like semiconductor films. Any of an amorphous semiconductor film, a crystalline semiconductor film, and a microcrystalline semiconductor film may be used as the semiconductor film. For example, in a case of forming an amorphous semiconductor film, the amorphous semiconductor film is formed first and heated to crystallize by heat treatment to form a crystalline semiconductor film. The heat treatment can be performed using a heating furnace, laser irradiation, light-irradiation from a lamp instead of laser light (hereinafter, referred to as lamp annealing), or a combination thereof.

In the case of laser irradiation, a continuous wave (CW) laser or a pulsed laser can be used.

In the case of the pulsed laser, a pulsed laser light is oscillated with such a repetition rate that the laser light of the next pulse is emitted before solidifying the semiconductor film that has been melted. This makes it possible to obtain crystal grains which are sequentially grown in the scanning direction. In other words, it is possible to use a pulsed beam with a lower limit of a repetition rate that is set shorter than the time required for the melted semiconductor film to solidify completely. The pulsed beam that can be used actually is a repetition rate of 10 MHz or more. This repetition rate is extremely higher than that of the pulsed laser used usually, which is from several tens to several hundred Hz, to perform laser crystallization.

In the case of using a heating furnace for another heat treatment, an amorphous semiconductor film is heated at a temperature of 500 to 550° C. for 2 to 20 hours. At this time, the temperature is preferably set in multiple stages in the range of 500 to 550° C. so as to gradually reach a higher temperature. Since hydrogen or the like of the amorphous semiconductor film is released in the first low temperature heating process, so-called dehydrogenation can be performed to reduce film roughness during crystallization. When a metal element for promoting crystallization, for example, Ni is further formed over the amorphous semiconductor film, the heat temperature can be lowered, which is preferable. Even in the case of crystallization using such a metal element, heat treatment may be performed at a temperature of 600 to 950° C.

However, in the case of forming a metal element, there is a concern that the metal element may adversely affect electric characteristics of a semiconductor element. Thus, a gettering step is required to reduce or remove the metal element. For example, the step of gettering the metal element may be performed using the amorphous semiconductor film as a gettering sink.

Further, in the TFTs 601R, 601G, and 601B, a gate insulating film covering the semiconductor film, a gate electrode in which a first conductive film and a second conductive film are stacked, and an insulating film over the gate electrode are provided.

The TFTs 601R, 601G, and 601B each have a semiconductor film having a p-type impurity region. In this embodiment mode, a so-called single drain structure only having a high-concentration impurity region as an impurity region is adopted. Needless to say, the TFTs 601R, 601G, and 601B may have an LDD (Lightly Doped Drain) structure in which a low concentration impurity region and a high concentration impurity region are provided in a semiconductor film or a GOLD (Gate Overlapped Drain) structure in which an impurity region is overlapped with a gate electrode.

The TFTs 601R, 601G, and 601B are covered with an interlayer insulating film 607, and a partition wall 608 having an opening is formed over the interlayer insulating film 607. The first electrode 101 is exposed in the opening of the partition wall 608, and the electroluminescent layers 605R, 605G, and 605B, and the second electrode 102 are each sequentially stacked over the first electrode 101.

The electroluminescent layers 605R, 605G, and 605B correspond to the first layer 111, the second layer 112, and the third layer 113, respectively; thus, the film thickness of any one of the first to third layers is made different depending on each light-emission color so that light extraction efficiency can be increased. This embodiment mode shows a top emission type; thus, the film thickness of the first layer 111 closest to the stacked first electrode 101 is preferably made different depending on each light-emission color.

Much preferably, increase in driving voltage due to a thicker film thickness can be prevented by using a mixture layer where an organic compound and a metal oxide are mixed as the first layer 111. When the mixture layer where an organic compound and a metal oxide are mixed is used in such a manner, the second conductive layer 101b, which is the upper layer of the stacked first electrode 101, is to be formed of a material having low contact resistance with the mixture layer, which is a refractory metal material such as titanium nitride. In addition, the first conductive layer 101a is to be formed of a material having high reflectiveness such as aluminum. Note that the above embodiment mode can be referred to for the detail of the first conductive layer 101a and the second conductive layer 101b.

Consequently, high light extraction efficiency can be obtained concurrently with contact resistance between the mixture layer and the first electrode 101. Additionally, light extraction efficiency can be further increased by making different the film thickness of the first layer 111 depending on each light-emission color.

This embodiment mode is the case of a top emission type. Therefore, the stacked first electrode 101 is formed of the first conductive layer 101a made of a material having high reflectiveness and the second conductive layer 101b made of a material where the contact resistance with the first layer 111 is preferable, which is a refractory metal material. Embodiment Mode 1 can be referred to for the materials of the first conductive layer 101a and the second conductive layer 101b.

The material of the second electrode 102 is formed of a light-transmitting material. Embodiment Mode 1 can be referred to for the specific material.

Note that, in this embodiment mode, the first electrode 101 serves as an anode, and the second electrode 102 serves as a cathode. Therefore, it is preferable that the first electrode 101 is made of a material having a low work function and the second electrode 102 is made of a material having a high work function.

Since the TFTs 601R, 601G, and 601B are each a p-channel type, wirings each connected to the TFTs can be made to serve directly as the first electrode 101 which is an anode. The number of steps can also be reduced by thus sharing the wirings.

The first electrode 101 or the second electrode 102 can be formed by a sputtering method, a vapor deposition method, or the like.

The interlayer insulating film 607 can be formed using an organic resin material, an inorganic insulating material, or an insulator including a Si—O—Si bond formed of a siloxane-based resin (hereinafter, referred to as a siloxane insulator). The siloxane-based resin corresponds to a resin including a Si—O—Si bond. Siloxane is composed of a skeleton structure formed by the bond of silicon (Si) and oxygen (O), in which an organic group at least containing hydrogen (for example, an alkyl group or aromatic hydrocarbon) is included as a substituent. Alternatively, a fluoro group may be used as the substituent. Further alternatively, an organic group at least containing hydrogen and a fluoro group may be used as the substituent. In addition, a material referred to as a low dielectric constant material (low-k material) may be used for the interlayer insulating film 607.

The partition wall 608 can be formed using an organic resin material, an inorganic insulating material, or a siloxane insulator. For example, acrylic, polyimide, polyamide, or the like can be used as the organic resin material, and silicon oxide, silicon nitride oxide, or the like can be used as the inorganic insulating material. In particular, a photosensitive organic resin material is used for the partition wall 608, and an opening is formed over the first electrode 101 so that the side wall of the opening has an inclined plane with a continuous curvature. As a result, defective deposition, that is, a so-called disconnection can be prevented and a short circuit between the first electrode 101 and the second electrode 102 can be prevented.

In such a manner, it is possible to provide a top emission type light-emitting device in which light emitted from the light-emitting elements 603 can be extracted through the second electrode 102 as shown by an arrow.

According to a feature of the present invention, a conductive layer made of a refractory metal material in contact with the mixture layer having a metal oxide is formed as the first electrode 101. As for the conductive layer provided to be in contact with the mixture layer having a metal oxide, a material that is not oxidized by forming a mixture layer having the metal oxide or even when oxidized, a material which shows conductivity may be used. According to the present invention, contact resistance with the first layer 111, which is an electroluminescent layer, can be made preferable concurrently with increase in reflectiveness of the first electrode 101. Note that the present invention is not limited to the pixel structure shown in FIG. 3 as long as the above effect can be obtained. For example, in a case where the second electrode 102 is a reflective electrode and the mixture layer having a metal oxide is applied to the third layer 113 which is an electroluminescent layer, a conductive layer made of a refractory metal material in contact with the mixture layer having a metal oxide is formed as the second electrode 102 having a stacked structure; thus, a mode in which light is extracted downward is also acceptable. Even in such as case, contact resistance with the third layer 113, which is an electroluminescent layer, can be made preferable concurrently with increase in reflectiveness of the second electrode 102.

Embodiment Mode 4

In this embodiment mode, a cross-sectional structure of a pixel in a case where a driving transistor is an n-type TFT will be explained. Note that, in this embodiment mode, a first electrode is made to serve as a cathode and a second electrode as an anode. Therefore, a light-emitting element is to have a reverse stacked structure of that of the light-emitting element in FIG. 1.

Even in such a stacked structure of a light-emitting element, a mixture layer having a metal oxide can be used for a layer in contact with a reflective electrode among electroluminescent layers. When aluminum, silver, an aluminum alloy, or a silver alloy which is a material having high reflectiveness is used for the reflective electrode, the surface is oxidized; thus, the contact resistance with the mixture layer is increased. Therefore, even in the light-emitting element of this embodiment mode, titanium nitride, titanium, tungsten, molybdenum, or the like, which is a refractory metal material, can be used for the upper layer of the reflective electrode with the consideration of the contact resistance.

Figure 4:
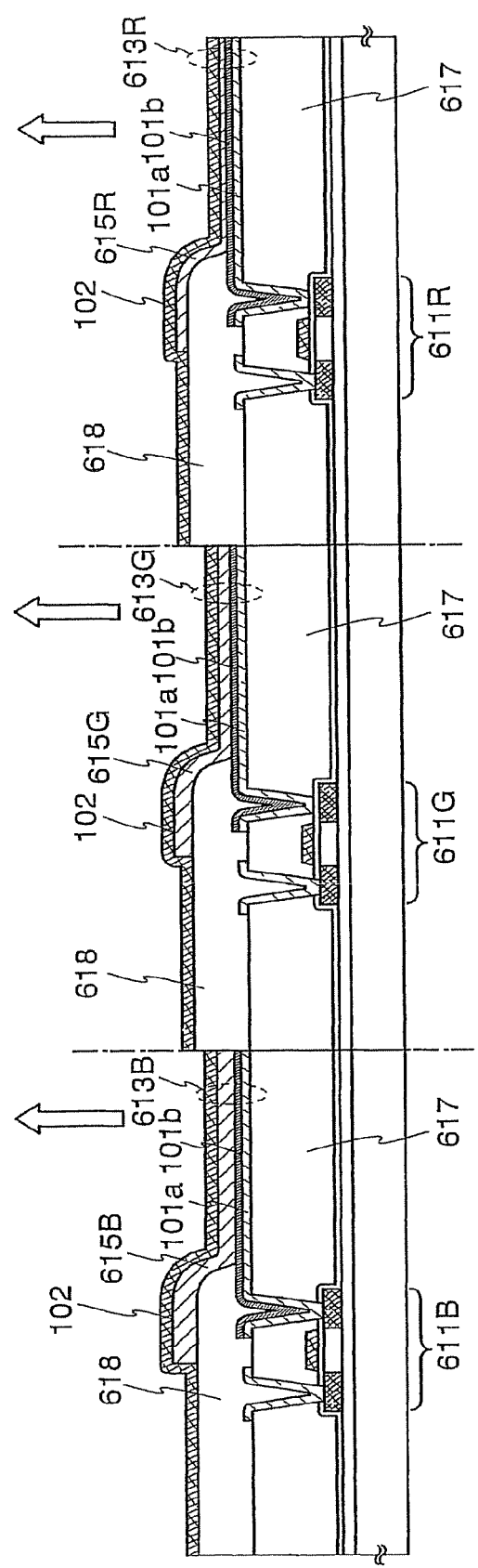
FIG. 4 is a cross-sectional view showing a pixel having a light-emitting element according to the present invention.

FIG. 4 is a cross-sectional view, which shows a so-called top emission type in which light emitted from each of light-emitting elements 613R, 613G and 613B is extracted through a second electrode 102. In addition, as well as FIG. 3, each light-emission color (RGB) can be emitted from the light-emitting elements 613R, 613G, and 613B, respectively (hereinafter, referred to as a light-emitting element 613 together). The light-emitting elements 613 each have a stacked first electrode 101 (including a first conductive layer 101a and a second conductive layer 101b) and the second electrode 102, and electroluminescent layers 615R, 615G; and 615B are provided therebetween. The electroluminescent layers 615R, 615G, and 615B correspond to the first layer 111 to the third layer 113, respectively. The electroluminescent 615R, 61G, and 615B each have different film thickness depending on each light-emission color. The first electrode 101 is electrically connected with TFTs 611R, 611G, and 611B, respectively.

The TFTs 611R, 611G, and 611B can be formed in the same manner as the TFTs 601R, 601G, and 601B in the above embodiment mode.

This embodiment mode is the case of a top emission type. Therefore, the stacked first electrode 101 is formed of the first conductive layer 101a made of a material having high reflectiveness and the second conductive layer 101b made of a material where the contact resistance with the first layer 111 is preferable. Embodiment Mode 1 can be referred to for the materials of the first conductive layer 101a and the second conductive layer 101b.

The material of the second electrode 102 is formed of a light-transmitting material. Embodiment Mode 1 can be referred to for the specific material.

Note that, the first electrode 101 serves as a cathode, and the second electrode 102 serves as an anode. Therefore, it is preferable that the first electrode 101 is made of a material having a high work function and the second electrode 102 is made of a material having a low work function.

Note that, since the driving transistors are each n-channel type, wirings each connected to the TFTs 611R, 611G, and 611B can be used directly as the first electrode 101 that serves as a cathode. The number of steps can also be reduced by thus sharing the wirings.

The electroluminescent layers 615R, 615G, and 615B correspond to the first layer 111, the second layer 112, and the third layer 113, respectively; thus, the film thickness of any one of the first to third layers is made different depending on each light-emission color so that light extraction efficiency can be increased. This embodiment mode shows a top emission type; thus, the film thickness of the first layer 111 closest to the first electrode 101 is preferably made different depending on each light-emission color.

Further, increase in driving voltage due to a thicker film thickness can be prevented by using the mixture layer where an organic compound and a metal oxide are mixed as the first layer 111. The following can be given as such a metal oxide: lithium oxide ($Li_2O$), calcium oxide (CaO), sodium oxide ($Na_2O$), potassium oxide ($K_2O$), magnesium oxide (MgO), lithium fluoride (LiF), cesium fluoride (CsF), calcium fluoride ($CaF_2$), and the like. The second conductive layer 101b, which is the upper layer of the stacked first electrode 101, is to be formed of a refractory metal material such as titanium nitride, titanium, tungsten, or molybdenum, which has low contact resistance. In addition, the first conductive layer 101a is to be formed of a material having high reflectiveness such as aluminum, silver, an aluminum alloy, or a silver alloy.

Consequently, high light extraction efficiency can be obtained concurrently with preferable contact resistance between the mixture layer and the first electrode 101. Additionally, light extraction efficiency can be further increased by making different the film thickness of the first layer 111 depending on each light-emission color.

In such a manner, it is possible to provide a top emission type light-emitting device in which light emitted from the light-emitting elements 613 can be extracted through the second electrode 102 as shown by an arrow.

According to a feature of the present invention, a conductive layer made of a refractory metal material in contact with the mixture layer having a metal oxide is formed as the first electrode 101. As for the conductive layer provided to be in contact with the mixture layer having a metal oxide, a material that is not oxidized by forming a mixture layer having the metal oxide or, even when oxidized, a material which shows conductivity may be used. According to the present invention, contact resistance with the first layer 111 which is an electroluminescent layer; can be made preferable concurrently with increase in reflectiveness of the first electrode 101. Note that the present invention is not limited to the pixel structure shown in FIG. 4 as long as the above effect can be obtained. For example, in a case where the second electrode 102 is a reflective electrode and the mixture layer having a metal oxide is applied to the third layer 113 which is an electroluminescent layer, a conductive layer made of a refractory metal material in contact with the mixture layer having a metal oxide is formed as the second electrode 102 having a stacked structure; thus, a mode in which light is extracted downward is also acceptable. Even in such as case, contact resistance with the third layer 113, which is an electroluminescent layer, can be made preferable concurrently with increase in reflectiveness of the second electrode 102.

Embodiment Mode 5

In this embodiment mode, a cross-sectional structure of a pixel in a case where a transistor having an amorphous semiconductor film (amorphous transistor) is used for each transistor will be explained.

Even in a pixel structure shown in this embodiment mode, a mixture layer having a metal oxide can be used for a layer, which is in contact with a reflective electrode, among electroluminescent layers. When aluminum, silver, an aluminum alloy, or a silver alloy which is a material having high reflectiveness is used for the reflective electrode, the surface is oxidized; thus, the contact resistance with the mixture layer is increased. Therefore, even in the light-emitting element of this embodiment mode, titanium nitride, titanium, tungsten, molybdenum, or the like, which is a refractory metal material, can be used for the upper layer of the reflective electrode with the consideration of the contact resistance.

Note that, in this embodiment mode, an amorphous transistor has an n-type semiconductor film. According to such an n-type semiconductor film, contact resistance of source and drain electrodes can be made preferable. Transistors 621R, 621G, and 621B each having n-type conductivity are used; therefore, a structure where a first electrode is made to serve as a cathode and a second electrode as an anode is the same as that of Embodiment Mode 4. In addition, since the other structures are the same as those of Embodiment Modes 3 and 4, the explanation will be omitted.

Figure 13:
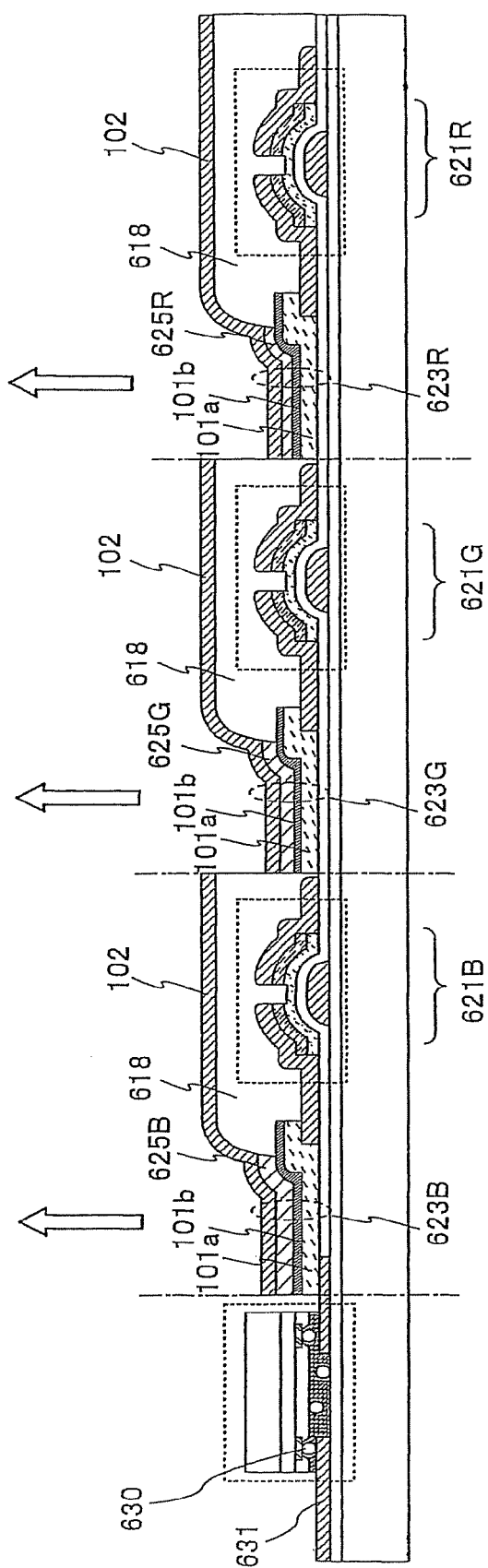
FIG. 13 a cross-sectional view showing a pixel having a light-emitting element according to the present invention.

FIG. 13 is a cross-sectional view, which shows a top emission type in which light emitted from each of light-emitting elements 623R, 623G and 623B (hereinafter, referred to as a light-emitting element 613 together) is extracted through a second electrode 102. In addition, as well as FIG. 3, the light-emitting elements 623 each have a stacked first electrode 101 (including a first conductive layer 101a and a second conductive layer 101b) and the second electrode 102, and electroluminescent layers 625R, 625G, and 625B are provided therebetween. The electroluminescent layers 625R, 625G and 625B correspond to the first layer 111 to the third layer 113, respectively. The electroluminescent layers 625R, 625G, and 625B each have different film thickness depending on each light-emission color. The first electrode 101 is electrically connected with the TFTs 621R, 621G, and 621B, respectively.

This embodiment mode is the case of a top emission type. Therefore, the stacked first electrode 101 is formed of the first conductive layer 101a made of a material having high reflectiveness and the second conductive layer 101b made of a material where the contact resistance with the first layer 111 is preferable. Embodiment Mode 1 can be referred to for the materials of the first conductive layer 101a and the second conductive layer 101b.

The material of the second electrode 102 is formed of a light-transmitting material. Embodiment Mode 1 can be referred to for the specific material.

Note that, the first electrode 101 serves as a cathode, and the second electrode 102 serves as an anode. Therefore, it is preferable that the first electrode 101 is made of a material having a high work function and the second electrode 102 is made of a material having a low work function.

Then, it is possible to provide a top emission type light-emitting device in which light emitted from the light-emitting elements 623 can be extracted through the second electrode 102 as shown by an arrow.

In the case of using such an amorphous transistor, a driver circuit is formed of a chip 630. Then, the chip 630 is electrically connected to the amorphous transistors with the use of a connection wiring. In addition, the chip 630 is electrically connected to an external circuit through another connection wiring 631.

When such an amorphous transistor is provided in a pixel portion, planarity is increased and the number of the layers in a stack is reduced; therefore, a thin shape of a display device can be achieved.

According to a feature of the present invention, a conductive layer made of a refractory metal material in contact with the mixture layer having a metal oxide is formed as the first electrode 101. As for the conductive layer provided to be in contact with the mixture layer having a metal oxide, a material that is not oxidized by forming a mixture layer having the metal oxide or, even when oxidized, a material which shows conductivity may be used. According to the present invention, contact resistance with the first layer 111, which is an electroluminescent layer, can be made preferable concurrently with increase in reflectiveness of the first electrode 101. Note that the present invention is not limited to the pixel structure shown in FIG. 13 as long as the above effect can be obtained. For example, in a case where the second electrode 102 is a reflective electrode and the mixture layer having a metal oxide is applied to the third layer 113 which is an electroluminescent layer, a conductive layer made of a refractory metal material in contact with the mixture layer having a metal oxide is formed as the second electrode 102 having a stacked structure; thus, a mode in which light is extracted downward is also acceptable. Even in such as case, contact resistance with the third layer 113, which is an electroluminescent layer, can be made preferable concurrently with increase in reflectiveness of the second electrode 102.

Embodiment Mode 6

In this embodiment mode, a passive-type pixel structure will be explained with reference to FIG. 14.

FIG. 14 shows a pixel structure in which a light-emitting element 633 is provided over a substrate having an insulating surface (insulating substrate). Note that an insulating film that serves as a base film may be provided over the substrate. The light-emitting element 633 has a stacked first electrode 101 (including a first conductive layer 101a and a second conductive layer 101b) and a second electrode 102. The first electrode 101 and the second electrode 102 are provided to intersect with each other.

An electroluminescent layer 625 is provided between the first electrode 101 and the second electrode 102, that is, an intersection of the first electrode 101 and the second electrode 102. The electroluminescent layer 625 corresponds to the first layer 111 to the third layer 113. For example, a mixture layer having a metal oxide is used for the first layer 111.

Note that, in the passive type pixel, the contiguous electroluminescent layer can be divided by an insulating film 628 (including a first insulating film 628a and a second insulating film 628b in this embodiment mode) that serves as a bank. The first insulating film 628a and the second insulating film 628b are formed over the first electrode 101. After pattering the insulating films into a predetermined shape, the second insulating film 628b is formed into such a shape where the insulating film becomes narrower toward the bottom. In other words, the side surface of the second insulating film 628b has a so-called tapered shape that is inclined with a certain angle. Consequently, even in a case where the electroluminescent layer 625 is formed over the entire surface, the electroluminescent layer 625 can be divided by the insulating film 628; thus, the contiguous electroluminescent layer can be divided.

In addition, a transistor 635 that serves as a switching element is connected to the first electrode 101. In this embodiment mode, a thin film transistor having an amorphous semiconductor film formed over the same substrate is used as the transistor. However, without limitation thereto, a thin film transistor having a crystalline semiconductor film or an IC chip made of a single-crystal silicon may also be used.

In such a passive type pixel structure, the present invention where a conductive layer made of a refractory metal material in contact with the mixture layer having a metal oxide is formed as the first electrode 101 can be applied to the passive type pixel structure. Note that the present invention is not limited to the pixel structure shown in FIG. 14 as long as the above effect can be obtained. For example, in a case where the second electrode 102 is a reflective electrode and the mixture layer having a metal oxide is applied to the third layer 113, a conductive layer made of a refractory metal material in contact with the mixture layer having a metal oxide is formed as the second electrode 102 having a stacked structure. Consequently, contact resistance with the third layer 113 can be preferable concurrently with increase in reflectiveness of the second electrode 102.

Embodiment Mode 7

In this embodiment mode, an equivalent circuit diagram of a pixel having a light-emitting element will be explained with reference to FIGS. 5A to 5C and FIG. 12.

Figure 5A:
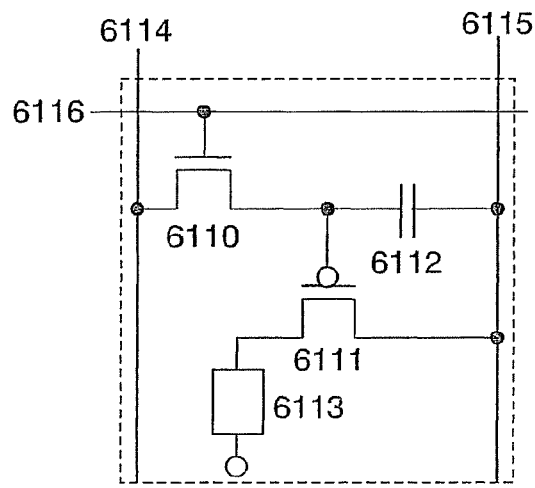
FIGS. 5A to 5C are diagrams each showing a pixel circuit having a light-emitting element according to the present invention.

FIG. 5A shows an example of an equivalent circuit diagram of a pixel, which includes a signal line 6114, a power supply line 6115, a scanning line 6116, a light-emitting element 6113, transistors 6110 and 6111, and a capacitor element 6112 at the intersection formed by the signal line 6114, the power supply line 6115, and the scanning line 6116. The signal line 6114 is inputted with a video signal by a signal-line driver circuit. The transistor 6110 can control supply of current the ON and OFF, of which is controlled and inputted to the transistor 6111 in accordance with a selection signal inputted to the scanning line 6116 from a scanning-line driver circuit. Such a transistor 6110 can be referred to as a switching transistor. When the transistor 6110 is turned ON, electric charge is stored in the capacitor element 6112, and the transistor 6111 turns ON when the electric charge exceeds potential between a gate and a source of the transistor 6111; thus, current is supplied from the power supply line 6115. Then, current to the light-emitting element 6113 is supplied. Accordingly, light emission of the light-emitting element 6113 can be controlled. Such a transistor 6111 can be referred to as a driving transistor. Note that FIG. 5A shows the capacitor element 6112; however, it is not required to be provided if the gate capacitance of the transistor 6111 or the other parasitic capacitance can substitute for it.

Figure 5B:
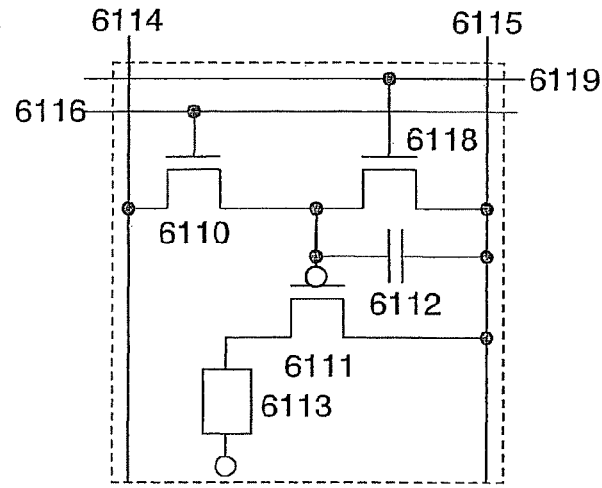

FIG. 5B is an equivalent circuit diagram of a pixel where a transistor 6118 and a scanning line 6119 are additionally provided in the pixel shown in FIG. 5A. By the transistor 6118, potentials of a gate and a source of the transistor 6111 can be equal to each other so as to forcibly flow no current into the light-emitting element 6113. Specifically, in order to discharge the electric charge stored in the capacitor element 6112, source and drain electrodes of the transistor 6118 are connected to the both ends of the capacitor element 6112. Then, ON and OFF of the transistor 6118 is controlled by the scanning line 6119. Such a transistor 6118 can be referred to as an erasing transistor.

The length for a sub-frame period can be set to be shorter than a period for inputting a video signal into all pixels. In addition, a state in which no current forcibly flows to the light-emitting element 6113 can be obtained depending on a driving method, even in the pixel shown in FIG. 5A.

Figure 5C:
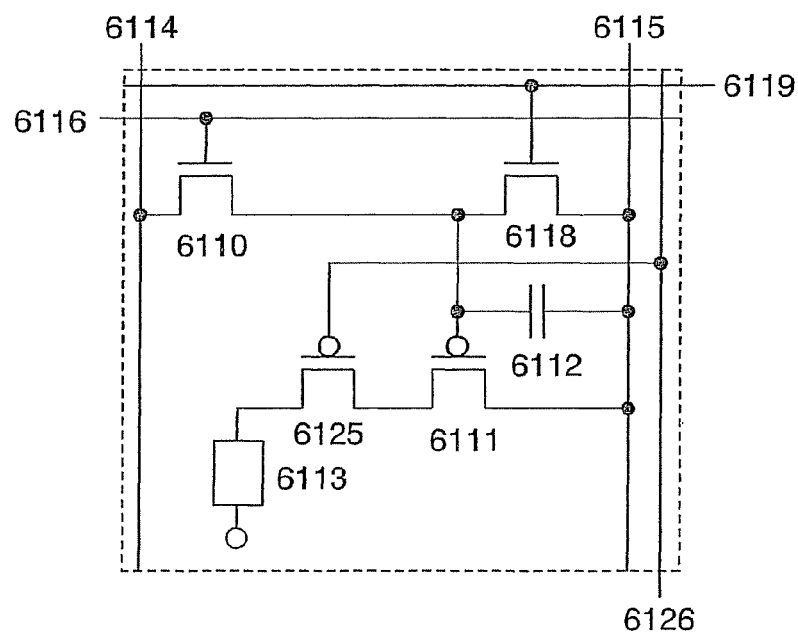

FIG. 5C is an equivalent circuit diagram of a pixel where a transistor 6125 and a wiring 6126 are additionally provided in the pixel shown in FIG. 5B. Gate potential of the transistor 6125 is fixed by the wiring 6126. In addition, the transistors 6111 and 6125 are connected in series between the power supply line 6115 and the light-emitting element 6113. In FIG. 5C, accordingly, the transistor 6125 controls the amount of current supplied to the light-emitting element 6113; thus, the transistor 6111 can control whether the current is supplied or not to the light-emitting element 6113.

Figure 12:
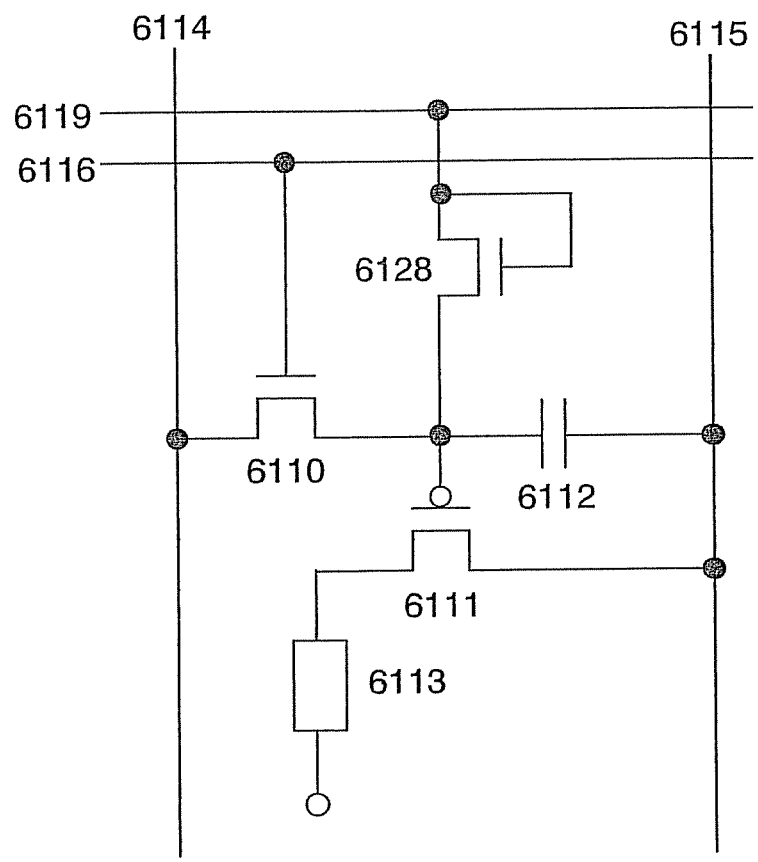
FIG. 12 is a diagram showing a pixel circuit having a light-emitting element according to the present invention.

FIG. 12 shows a pixel circuit where a diode 6128 is provided in order to make equal potentials of a gate and a source of the transistor 6111 to each other so as to forcibly flow no current into the light-emitting element 6113. The diode 6128 is connected to a gate electrode of the transistor 6111 and the scanning line 6119. When the scanning line 6119 is selected, the diode 6128 is turned ON, and potential of the scanning line 6119 and gate potential of the transistor 6111 gets equal; thus, the transistor 6111 is turned OFF. Consequently, no current from the power supply line 6115 is supplied to the light-emitting element 6113. In this embodiment mode, when the diode 6128 is turned ON, an n-type diode and a p-type transistor are used so that the transistor 6111 is turned OFF, and a High signal is inputted to the scanning line 6119.

In the pixel structure of this embodiment mode, in a case of holding the light-emitting element 6113 in a light-emitting state, a Low signal is inputted to the scanning line 6119. Thus, the diode 6128 is turned OFF, and the gate potential of the transistor 6111 can be held.

Note that the case where a transistor connected to a diode (a mode in which a gate and a drain are connected because of an n-type transistor) is shown; however, any transistor is acceptable as long as the element has rectification. For example, a PN diode, a PIN diode, a Schottky diode, or a Zener diode may be used for the diode 6128.

Note that pixel circuit according to the present invention is not limited to a structure shown in this embodiment mode. In addition, this embodiment mode can be arbitrarily combined with the above embodiment modes.

Embodiment Mode 8

As an electronic device provided with a light-emitting device according to the present invention, a television device (also referred to as a television or a television receiver), a camera such as a digital camera or a digital video camera, a cellular phone device (also referred to as a cellular phone handset or a cellular phone), a portable information terminal such as a FDA, a portable game machine, a computer monitor, a computer, an audio reproducing device such as a car audio, an image reproducing device provided with a recording medium such as a home game machine, and the like can be given. Specific examples thereof will be explained with reference to FIGS. 6A to 6F.

Figure 6A:
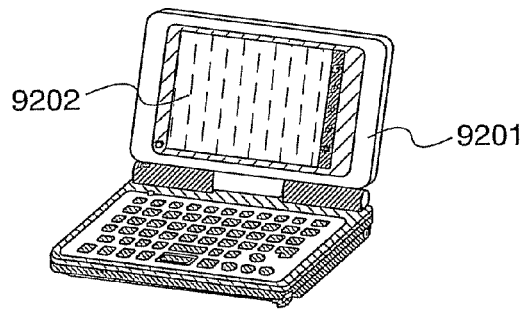
FIGS. 6A to 6F are views each showing an electronic device having a light-emitting element according to the present invention.

A portable information terminal shown in FIG. 6A includes a main body 9201, a display portion 9202, and the like. A light-emitting device according to the present invention can be applied to the display portion 9202. Consequently, it is possible to make contact resistance preferable and sufficient current flow. In addition, light extraction efficiency can be improved by suppressing a film thickness. Accordingly, it is possible to provide a portable information terminal where the drive voltage can be suppressed.

Figure 6B:
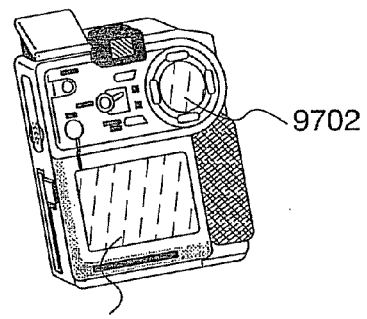

A digital video camera shown in FIG. 6B includes a display portion 9701, a display portion 9702, and the like. A light-emitting device according to the present invention can be applied to the display portion 9701. Consequently, it is possible to make contact resistance preferable and sufficient current flow. In addition, light extraction efficiency can be improved by suppressing a film thickness. Accordingly, it is possible to provide a digital video camera where the drive voltage can be suppressed.

Figure 6C:
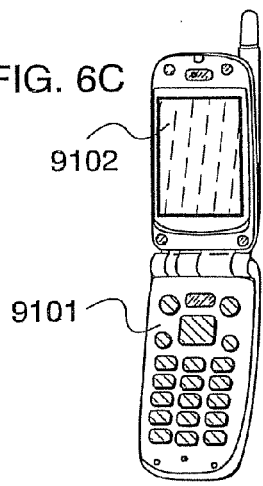

A cellular phone handset shown in FIG. 6C includes a main body 9101, a display portion 9102, and the like. A light-emitting device according to the present invention can be applied to the display portion 9102. Consequently, it is possible to make contact resistance preferable and sufficient current flow. In addition, light extraction efficiency can be improved by suppressing a film thickness. Accordingly, it is possible to provide a cellular phone handset where the drive voltage can be suppressed.

Figure 6D:
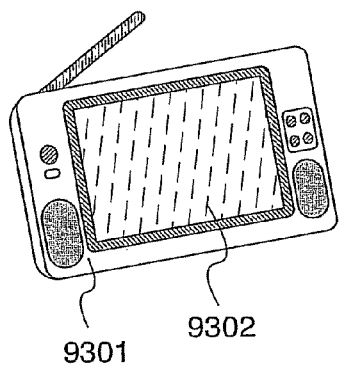

A portable television device shown in FIG. 6D includes a main body 9301, a display portion 9302, and the like. A light-emitting device according to the present invention can be applied to the display portion 9302. Consequently, it is possible to make contact resistance preferable and sufficient current flow. In addition, light extraction efficiency can be improved by suppressing a film thickness. Accordingly, it is possible to provide a portable television device where the drive voltage can be suppressed. Moreover, a light-emitting device according to the present invention can be applied to a wide range including a compact size mounted on a portable terminal such as a cellular phone handset, a portable medium size, or a large size (for example, 40 inch or more).

Figure 6E:
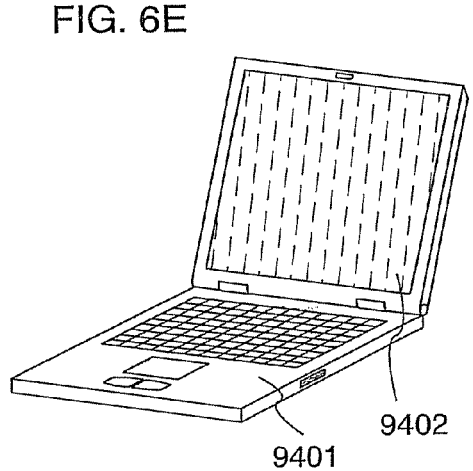

A laptop computer shown in FIG. 6E includes a main body 9401, a display portion 9402, and the like. A light-emitting device according to the present invention can be applied to the display portion 9402. Consequently, it is possible to make contact resistance preferable and sufficient current flow. In addition, light extraction efficiency can be improved by suppressing a film thickness. Accordingly, it is possible to provide a laptop computer where the drive voltage can be suppressed.

Figure 6F:
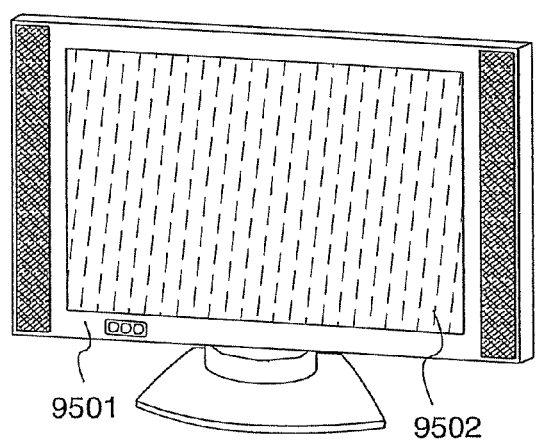

A television device shown in FIG. 6F includes a main body 9501, a display portion 9502, and the like. A light-emitting device according to the present invention can be applied to the display portion 9502. Consequently, it is possible to make contact resistance preferable and sufficient current flow. In addition, light extraction efficiency can be improved by suppressing a film thickness. Accordingly, it is possible to provide a television device where the drive voltage can be suppressed.

Accordingly, it is possible to provide electronic devices where the contact resistance is made preferable and sufficient current can be made to flow, and the drive voltage can be suppressed by a light-emitting device according to the present invention in which the light extraction efficiency is improved by suppressing a film thickness.

Embodiment

This embodiment shows a simulated result to confirm that contact resistance with a mixture layer having a metal oxide can be improved and emission luminance can be improved when a reflective electrode where aluminum and titanium nitride are stacked is used in a light-emitting element. Note that molybdenum oxide is used as the metal oxide in this simulated result.

Figure 7:
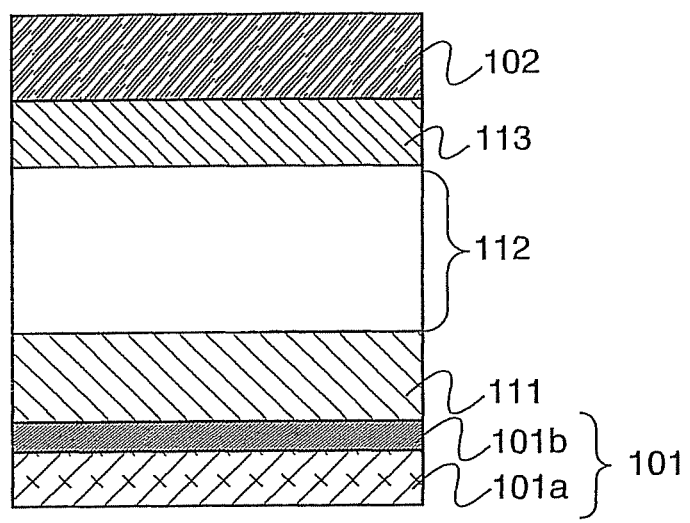
FIG. 7 is a view showing a light-emitting element according to the present invention used for simulation.

FIG. 7 shows a structure of a light-emitting element used for the simulation. The light-emitting element has a reflective electrode (50 nm) as the first electrode 101, a mixture layer having molybdenum oxide (having a different film thickness of each light-emission color at random) as the first layer 111, a light-emitting layer where each light-emission color is provided (40 nm in total) as the second layer 112, $Alq_3$ (20 nm) as the third layer 113, a stack of BzOs:Li (20 nm) and silver (15 nm) as the second electrode 102. The light-emitting layer contains t-BuDNA or $Alq_3$. In addition, since silver used for the second electrode 102 has an extremely thin film thickness, the light-emitting element has a light-transmitting property, which is a top emission type.

When a voltage of 6V is applied to such a light-emitting element (element region: 2×2 mm), the current value was 0.375 (mA/cm$^2$) in a case where aluminum is used for a reflective electrode and 7.825 (mA/cm$^2$) in a case where titanium nitride, which is a refractory metal material, is used. Accordingly, aluminum has high contact resistance with the mixture layer having molybdenum oxide, which shows that sufficient current cannot be made to flow. On the other hand, titanium nitride has low contact resistance with the mixture layer having molybdenum oxide, which shows that sufficient current can be made to flow. Therefore, it is found that titanium nitride, which is a refractory metal material, is preferably used for the reflective electrode, which is a layer in contact with the mixture layer having molybdenum oxide.

In addition, since the light-emitting element has a structure where a light source is provided inside, strong interference is generated when a semitransparent film of aluminum, silver, an aluminum alloy, a silver alloy, or the like is formed thin enough to have light-transmitting property as a transparent electrode. Thus, light extraction efficiency can be improved. In order to improve light extraction efficiency by applying interference of light by silver or the like in such a manner, a distance between a light-emitting region and a reflective electrode is preferably made different depending on each light-emission color.

Figure 8A:
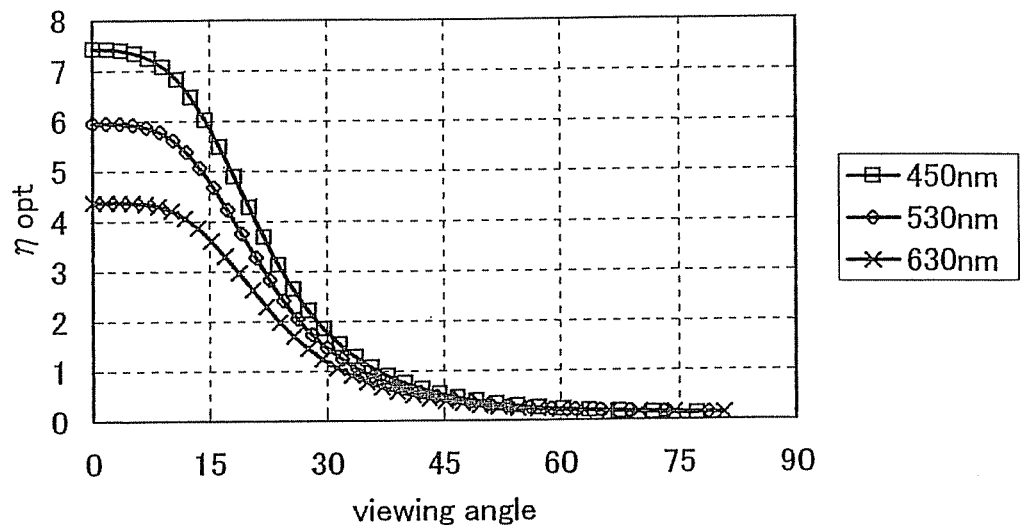
FIGS. 8A and 8B are graphs each showing a simulated result.

FIG. 8A shows light extraction efficiency $\eta_{opt}$ with respect to a viewing angle in a case where aluminum is used as the reflective electrode. Note that light extraction efficiency is a standard value where light of a light source without interference is taken as 1. In FIG. 8A, a light-emitting element where red light is emitted is shown by 630 nm which is an emission wavelength thereof, a light-emitting element where green light is emitted is shown by 530 nm which is an emission wavelength thereof, and a light-emitting element where blue light is emitted is shown by 450 nm which is an emission wavelength thereof. The film thickness of the mixture layer having molybdenum oxide in the light-emitting elements where red, green, and blue light are emitted is 238 nm, 178 nm, and 126 nm, respectively. Light extraction efficiency $\eta_{opt}$ can be improved by making different the mixture layer having molybdenum oxide, depending on each light-emission color.

Figure 8B:
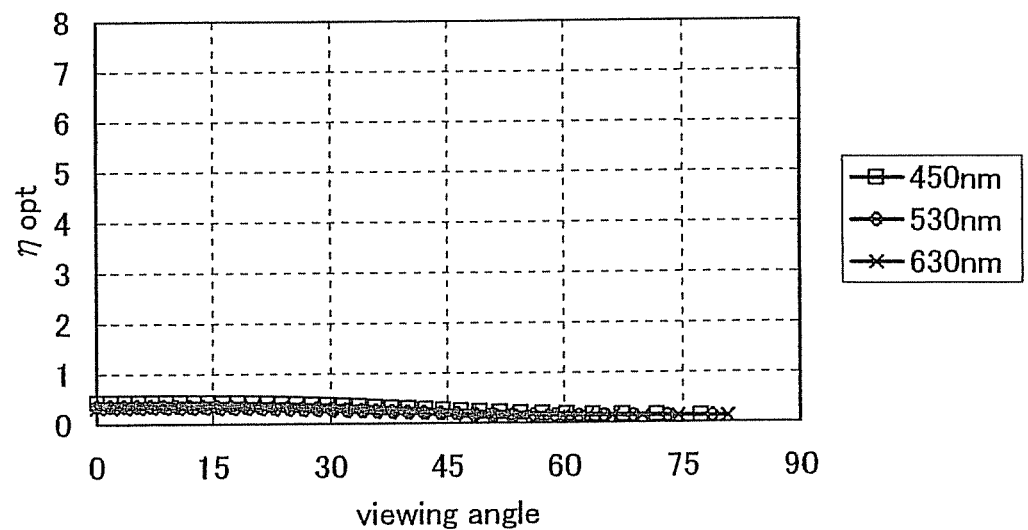

In addition, FIG. 8B shows a simulated result of light extraction efficiency $\eta_{opt}$ with respect to a viewing angle in a case where titanium nitride is used as the reflective electrode. The film thickness of the mixture layer having molybdenum oxide in the light-emitting elements where red, green, and blue light are emitted is 226 nm, 172 nm, and 126 nm, respectively. Light extraction efficiency $\eta_{opt}$ can be improved by making the mixture layer having molybdenum oxide different depending on each light-emission color.

According to FIGS. 8A and 8B, it is found that, in all viewing angles, the light extraction efficiency in the case where titanium nitride, which is a refractory metal material, is used as the reflective electrode is lower than the light extraction efficiency in the case where aluminum is used as the reflective electrode.

Through the above, it is found that contact resistance with the mixture layer having molybdenum oxide is improved when titanium nitride is used and thus sufficient current can be made to flow; however, the light extraction efficiency is decreased due to low reflectivity.

In the meantime, luminance $I_{ext}$ of the light-emitting element can be expressed in the following formula.

$$I_{ext} = \eta_{ext} \times J(\text{current density})$$

This formula shows that $\eta_{ext}$ is proportional to light extraction efficiency if there is no change in a structure of the light-emitting element. Therefore, the formula is as follows when light extraction efficiency is taken as $\eta_{opt}$.

$$I_{ext} \propto \eta_{opt} \times J$$

Figure 9A:
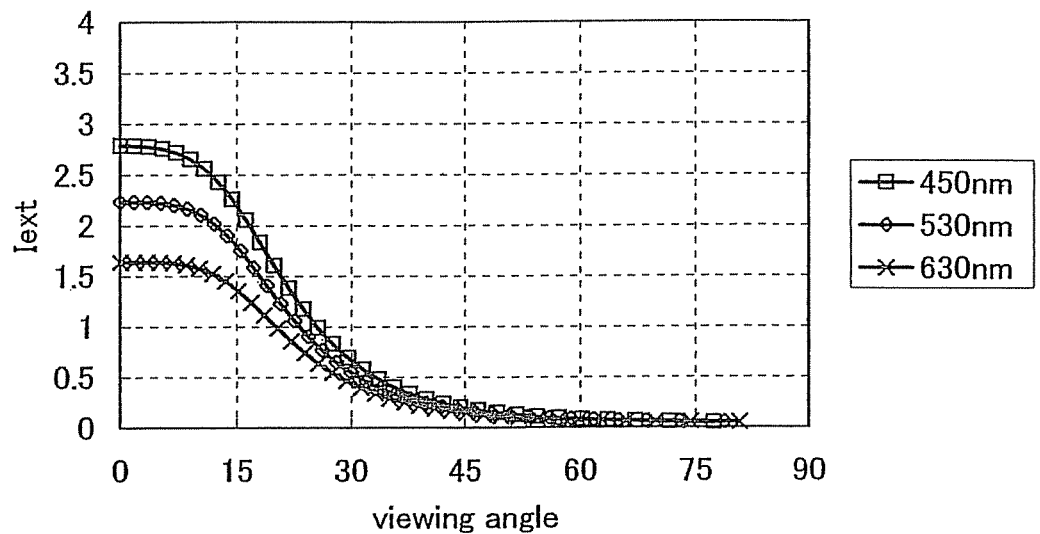
FIGS. 9A and 9B are graphs each showing a simulated result.
Figure 9B:
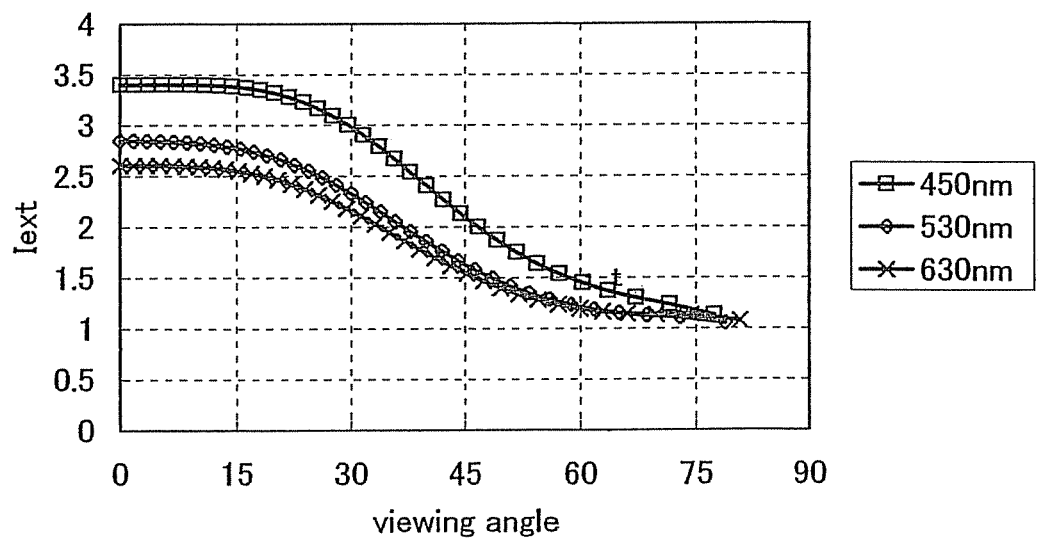

Therefore, it is possible to obtain the current value when a voltage of 6V is applied and, according to the simulated result in FIGS. 8A and 8B, relative luminance when aluminum and titanium nitride are each used for the reflective electrode. FIGS. 9A and 9B are the case where aluminum and titanium nitride are each used for the reflective electrode, which each show relative luminance at the time of applying 6V. FIG. 9A shows luminance with respect to a viewing angle in the case where aluminum is used as the reflective electrode, and FIG. 9B shows luminance with respect to a viewing angle in the case where titanium nitride is used as the reflective electrode. Note that, also in FIGS. 9A and 9B, light extraction efficiency is increased by making different the mixture layer having molybdenum oxide depending on each light-emitting element where each light is emitted so as to have the same film thickness as that in FIGS. 8A and 8B.

According to FIGS. 9A and 9B, it is found that, in all viewing angles, the luminance in the case where titanium nitride, which is a refractory metal material, is used as the reflective electrode is higher than the light extraction efficiency in the case where aluminum is used as the reflective electrode.

Thus, according to the present invention, by a reflective electrode where titanium nitride formed in 1 to 20 nm thick is provided over aluminum, it is realized to obtain a light-emitting element having high luminance where decrease in reflectivity of light with respect to the reflective electrode is suppressed, that is, the maximum reflectivity is obtained, concurrently with preferable contact resistance with the mixture layer having molybdenum oxide.

Hereinafter, an experiment result that shows an effect of using a reflective electrode according to the present invention will be shown.

In the light-emitting element shown in FIG. 7, the current value at the time of applying a voltage of 6V in the light-emitting element sized 2×2 mm using a reflective electrode where titanium nitride is formed to be approximately 10 nm thick over aluminum was 8.05 (mA/cm$^2$). In other words, it was found that contact resistance with the mixture layer having molybdenum oxide which is the same as the contact resistance with titanium nitride can be obtained in the case of using the reflective electrode where titanium nitride is formed to be approximately 10 nm thick over aluminum. In addition, this current value is higher than a value when a single layer of titanium nitride used as the reflective electrode, which shows that a stack of aluminum and titanium nitride is preferable to the single layer of titanium nitride to be used as the reflective electrode.

Figure 10:
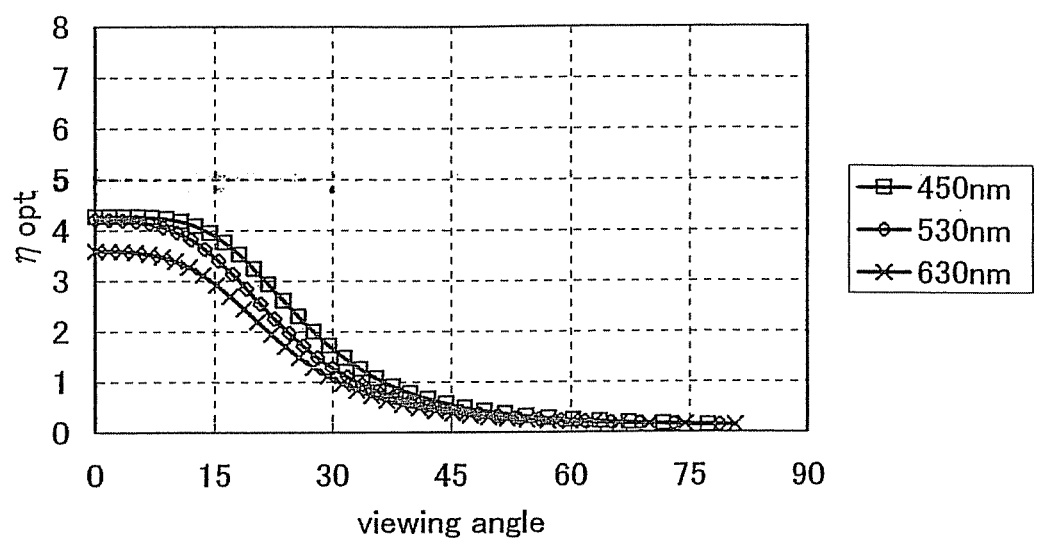
FIG. 10 is a graph showing a simulated result.

FIG. 10 shows a simulated result to obtain light extraction efficiency in a case where a reflective electrode where titanium nitride in 5 nm thick is formed over aluminum is used. The light extraction efficiency is decreased compared with the case of aluminum shown in FIG. 8A. However, it is found that the light extraction efficiency is improved tremendously compared with the single layer of titanium nitride shown in FIG. 8B.

Figure 11:
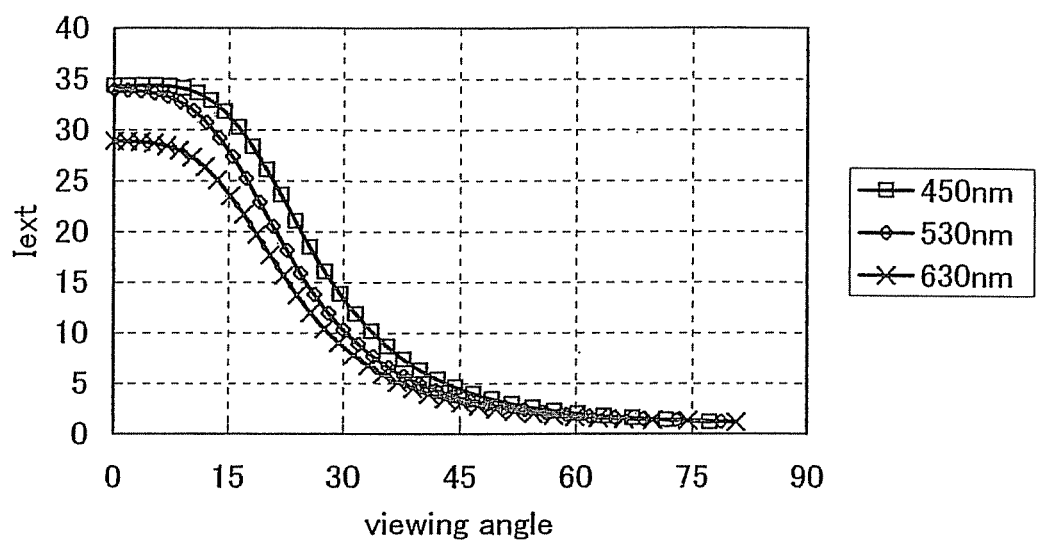
FIG. 11 is a graph showing a simulated result.

With the use of this result and the current value which is 8.05 (mA/cm$^2$) at the time of applying 6V, relative luminance at the time of applying 6V in the case of using the reflective electrode where titanium nitride in 5 nm thick is formed over aluminum can be simulated. The result is as shown in FIG. 11 and it is found that tremendous luminance is profitable compared with a single layer of aluminum and titanium nitride.

According to the present invention in which thin titanium nitride to be approximately 1 to 20 nm thick is provided over aluminum in such a manner, it is realized to obtain a light-emitting element having high luminance where decrease in reflectivity of light with respect to a reflective electrode is suppressed concurrently with obtaining preferable contact resistance with the mixture layer having molybdenum oxide.

The present application is based on Japanese Patent Application serial No. 2005-088807 filed on Mar. 25, 2005 in Japanese Patent Office, the entire contents of which are hereby incorporated by reference.

What is claimed is:

1. A light-emitting device comprising:
   a first conductive film over a substrate;
   a second conductive film over the first conductive film;
   a layer comprising a metal oxide and an organic material over and in contact with the second conductive film;
   a light-emitting layer over the layer; and
   a third conductive film over the light-emitting layer,
   wherein the first conductive film comprises an alloy including aluminum, and
   wherein the second conductive film comprises a refractory metal.

2. The light-emitting device according to claim 1, wherein the refractory metal comprises any one of titanium, tungsten, and molybdenum.

3. A light-emitting device comprising:
   a first conductive film over a substrate;
   a second conductive film over the first conductive film;
   a layer comprising a metal oxide and an organic material over and in contact with the second conductive film;
   a light-emitting layer over the layer; and
   a third conductive film over the light-emitting layer,
   wherein the first conductive film comprises an alloy including silver, and
   wherein the second conductive film comprises a refractory metal.

4. The light-emitting device according to claim 3, wherein the refractory metal comprises any one of titanium, tungsten, and molybdenum.

5. A light-emitting device comprising:
   a first conductive film over a substrate;
   a second conductive film over the first conductive film;
   a layer comprising a metal oxide and an organic material over and in contact with the second conductive film;
   a light-emitting layer over the layer; and
   a third conductive film over the light-emitting layer,
   wherein the first conductive film comprises an alloy including at least any one of aluminum and silver, and
   wherein the second conductive film comprises a refractory metal.

6. The light-emitting device according to claim 5, wherein the refractory metal comprises any one of titanium, tungsten, and molybdenum.

7. A light-emitting device comprising:
   a first conductive film over a substrate;
   a second conductive film over the first conductive film;
   a layer comprising a metal oxide and an organic material over and in contact with over the second conductive film;
   a light-emitting layer over the layer; and
   a third conductive film over the light-emitting layer,
   wherein the first conductive film comprises an alloy including aluminum, and
   wherein the second conductive film comprises a nitride material of a refractory metal.

8. The light-emitting device according to claim 7, wherein the refractory metal comprises titanium.

9. A light-emitting device comprising:
a first conductive film over a substrate;
a second conductive film over the first conductive film;
a layer comprising a metal oxide and an organic material over and in contact with the second conductive film;
a light-emitting layer over the layer; and
a third conductive film over the light-emitting layer,
wherein the first conductive film comprises an alloy including silver, and
wherein the second conductive film comprises a nitride material of a refractory metal.

10. The light-emitting device according to claim 9,
wherein the refractory metal comprises titanium.

11. A light-emitting device comprising:
a first conductive film over a substrate;
a second conductive film over the first conductive film;
a layer comprising a metal oxide and an organic material over and in contact with the second conductive film;
a light-emitting layer over the layer; and
a third conductive film over the light-emitting layer,
wherein the first conductive film comprises an alloy including at least any one of aluminum and silver, and
wherein the second conductive film comprises a nitride material of a refractory metal.

12. The light-emitting device according to claim 11,
wherein the refractory metal comprises titanium.

13. A light-emitting device comprising:
a first conductive film over a substrate;
a second conductive film over the first conductive film;
a layer comprising a metal oxide and an organic material over and in contact with the second conductive film;
a light-emitting layer over the layer; and
a third conductive film over the light-emitting layer,
wherein the first conductive film comprises an alloy including aluminum, and
wherein the second conductive film comprises a titanium material.

14. The light-emitting device according to claim 13,
wherein the titanium material comprises titanium nitride.

15. A light-emitting device comprising:
a first conductive film over a substrate;
a second conductive film over the first conductive film;
a layer comprising a metal oxide and an organic material over and in contact with the second conductive film;
a light-emitting layer over the layer; and
a third conductive film over the light-emitting layer,
wherein the first conductive film comprises an alloy including silver, and
wherein the second conductive film comprises a titanium material.

16. The light-emitting device according to claim 15,
wherein the titanium material comprises titanium nitride.

17. A light-emitting device comprising:
a first conductive film over a substrate;
a second conductive film over the first conductive film;
a layer comprising a metal oxide and an organic material over and in contact with the second conductive film;
a light-emitting layer over the layer; and
a third conductive film over the light-emitting layer,
wherein the first conductive film comprises an alloy including at least any one of aluminum and silver, and
wherein the second conductive film comprises a titanium material.

18. The light-emitting device according to claim 17,
wherein the titanium material comprises titanium nitride.

* * * * *